United States Patent
Ma et al.

(10) Patent No.: US 12,349,570 B2
(45) Date of Patent: Jul. 1, 2025

(54) DISPLAY PANEL HAVING SHIELDING LINES AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Qian Ma, Beijing (CN); Jing Gao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 493 days.

(21) Appl. No.: 17/786,079

(22) PCT Filed: May 27, 2021

(86) PCT No.: PCT/CN2021/096444
§ 371 (c)(1),
(2) Date: Jun. 16, 2022

(87) PCT Pub. No.: WO2021/239061
PCT Pub. Date: Dec. 2, 2021

(65) Prior Publication Data
US 2023/0028604 A1  Jan. 26, 2023

(30) Foreign Application Priority Data

May 28, 2020  (CN) .......................... 202010470315.8

(51) Int. Cl.
*H01L 29/08* (2006.01)
*H10D 86/40* (2025.01)
(Continued)

(52) U.S. Cl.
CPC ......... *H10K 59/131* (2023.02); *H10D 86/441* (2025.01); *H10D 86/60* (2025.01);
(Continued)

(58) Field of Classification Search
CPC ............. H10K 59/131; H10K 59/1213; H10K 59/126; H10K 59/1216
(Continued)

(56) References Cited

U.S. PATENT DOCUMENTS

| 9,941,303 B1 | 4/2018 | Zhou |
| 2004/0263710 A1 | 12/2004 | Song et al. |

(Continued)

FOREIGN PATENT DOCUMENTS

| CN | 102109720 A | 6/2011 |
| CN | 103137068 A | 6/2013 |

(Continued)

OTHER PUBLICATIONS

Office Action for the Chinese Patent Application No. 202010470315.8 issued by the Chinese Patent Office on Jul. 28, 2021.
(Continued)

*Primary Examiner* — Phuc T Dang
(74) *Attorney, Agent, or Firm* — XSENSUS LLP

(57) ABSTRACT

A display panel includes a substrate, a plurality of pixel driving circuits, a plurality of first data lines, a plurality of second data lines and at least one shielding line. A first data line in the plurality of first data lines is electrically connected to pixel driving circuits in even-numbered rows in a same column of pixel driving circuits. A second data line in the plurality of second data lines that is arranged adjacent to the first data line is electrically connected to pixel driving circuits in odd-numbered rows in a same column of pixel driving circuits. The first data line and the second data line have an overlapping area therebetween. The at least one
(Continued)

shielding line is configured to transmit a fixed voltage. The at least one shielding line constitutes a first capacitor with the first data line, and/or a second capacitor with the second data line.

20 Claims, 22 Drawing Sheets

(51) Int. Cl.
*H10D 86/60* (2025.01)
*H10K 59/121* (2023.01)
*H10K 59/126* (2023.01)
*H10K 59/131* (2023.01)

(52) U.S. Cl.
CPC ..... *H10K 59/1213* (2023.02); *H10K 59/1216* (2023.02); *H10K 59/126* (2023.02)

(58) Field of Classification Search
USPC .......................................................... 257/40
See application file for complete search history.

(56) References Cited

U.S. PATENT DOCUMENTS

| | | | |
|---|---|---|---|
| 2008/0036699 A1 | 2/2008 | Yudasaka | |
| 2011/0157527 A1 | 6/2011 | Jo et al. | |
| 2013/0140538 A1 | 6/2013 | Fujita et al. | |
| 2013/0235020 A1 | 9/2013 | Kim et al. | |
| 2014/0167009 A1 | 6/2014 | Lee et al. | |
| 2014/0267962 A1 | 9/2014 | Jung et al. | |
| 2017/0345877 A1 | 11/2017 | Hwang | |
| 2018/0033362 A1* | 2/2018 | Yamazaki | G09G 3/3648 |
| 2019/0086742 A1 | 3/2019 | Huang et al. | |
| 2019/0096911 A1 | 3/2019 | Li et al. | |
| 2019/0206966 A1* | 7/2019 | Kim | H10K 59/1213 |
| 2019/0280076 A1 | 9/2019 | Bang et al. | |
| 2020/0083256 A1 | 3/2020 | Yoshida | |
| 2020/0168686 A1 | 5/2020 | Han et al. | |
| 2020/0185427 A1 | 6/2020 | Fan et al. | |
| 2020/0227500 A1 | 7/2020 | Chen et al. | |
| 2020/0380903 A1 | 12/2020 | Dong et al. | |
| 2021/0327360 A1 | 10/2021 | Dong | |
| 2021/0328000 A1 | 10/2021 | Jia et al. | |

FOREIGN PATENT DOCUMENTS

| | | | | |
|---|---|---|---|---|
| CN | 103872080 A | * | 6/2014 | ......... H01L 23/5225 |
| CN | 104049427 A | | 9/2014 | |
| CN | 104145213 A | | 11/2014 | |
| CN | 106855674 A | | 6/2017 | |
| CN | 107452773 A | | 12/2017 | |
| CN | 207148492 U | | 3/2018 | |
| CN | 207264070 U | | 4/2018 | |
| CN | 108231850 A | | 6/2018 | |
| CN | 109272930 A | | 1/2019 | |
| CN | 109389907 A | | 2/2019 | |
| CN | 208521584 U | | 2/2019 | |
| CN | 109742092 A | | 5/2019 | |
| CN | 110197647 A | | 9/2019 | |
| CN | 110246864 A | | 9/2019 | |
| CN | 110299384 A | | 10/2019 | |
| CN | 110827765 A | | 2/2020 | |
| CN | 110890386 A | | 3/2020 | |
| CN | 110956928 A | * | 4/2020 | |
| CN | 111564120 A | | 8/2020 | |
| EP | 0952479 A1 | | 10/1999 | |
| KR | 20180033362 A | * | 4/2018 | |
| KR | 20180051739 A | * | 5/2018 | |

OTHER PUBLICATIONS

Notification to Grant Patent Right for Invention for the Chinese Patent Application No. 202010470315.8 issued by the Chinese Patent Office on Mar. 21, 2022.

* cited by examiner

DISPLAY PANEL HAVING SHIELDING LINES AND DISPLAY DEVICE

CROSS-REFERENCE TO RELATED APPLICATIONS

This application is a national phase entry under 35 USC 371 of International Patent Application No. PCT/CN 2021/096444 filed on May 27, 2021, which claims priority to Chinese Patent Application No. 202010470315.8, filed on May 28, 2020, titled "DISPLAY PANEL AND DISPLAY DEVICE", which are incorporated herein by reference in their entirety.

TECHNICAL FIELD

The present disclosure relates to the field of display technologies, and in particular, to a display panel and a display device.

BACKGROUND

As a display panel develops towards a high resolution and a high refresh frequency, for each row of sub-pixels, time for writing data and compensating for a threshold voltage is decreased.

For each column of sub-pixels, two data lines are correspondingly provided. One of the two data lines is electrically connected to sub-pixels in odd-numbered rows, and another one of the two data lines is electrically connected to sub-pixels in even-numbered rows. This source driving architecture may increase the time for writing data and compensating for the threshold voltage.

SUMMARY

In an aspect, a display panel is provided. The display panel includes a substrate, a plurality of pixel driving circuits, a plurality of first data lines, a plurality of second data lines, and at least one shielding line that are all disposed on the substrate.

The plurality of pixel driving circuits are arranged in an array. A first data line in the plurality of first data lines is electrically connected to pixel driving circuits in even-numbered rows in a same column of pixel driving circuits. A second data line in the plurality of second data lines that is arranged adjacent to the first data line is electrically connected to pixel driving circuits in odd-numbered rows in a same column of pixel driving circuits. The first data line and the second data line have an overlapping area therebetween. The at least one shielding line is configured to transmit a fixed voltage. The at least one shielding line constitutes a first capacitor with the first data line, and/or a second capacitor with the second data line.

In some embodiments, a capacitance of the first capacitor and a capacitance of the second capacitor are equal.

In some embodiments, a shielding line in the at least one shielding line constitutes the first capacitor with the first data line, and an orthographic projection of the shielding line on the substrate is at least partially overlapped with an orthographic projection of the first data line on the substrate.

In some embodiments, the shielding line constitutes the second capacitor with the second data line, and the orthographic projection of the shielding line on the substrate is at least partially overlapped with an orthographic projection of the second data line on the substrate.

In some embodiments, the at least one shielding line includes a first shielding line and a second shielding line. The first shielding line constitutes the first capacitor with the first data line. The second shielding line constitutes the second capacitor with the second data line.

In some embodiments, the display panel further includes elements to be driven, a first power line, a second power line and an initialization signal line.

First electrodes of the elements to be driven are respectively electrically connected to the plurality of pixel driving circuit. The first power line is electrically connected to the plurality of pixel driving circuits, and is configured to transmit a first voltage signal to the plurality of pixel driving circuits. The second power line is electrically connected to second electrodes of the elements to be driven, and is configured to transmit a second voltage signal to the elements to be driven. The initialization signal line is electrically connected to the plurality of pixel driving circuits, and is configured to transmit an initialization signal to the plurality of pixel driving circuits.

The at least one shielding line is electrically connected to the first power line, the second power line, second electrodes of the elements to be driven or the initialization signal line.

In some embodiments, the display panel has a display region and a peripheral region. The first power line includes at least one sub-power line located in the display region, and a power bus located in the peripheral region and electrically connected to the at least one sub-power line. The at least one sub-power line is electrically connected to the plurality of pixel driving circuits. The at least one shielding line is electrically connected to the at least one sub-power line and/or the power bus.

In some embodiments, a shielding line in the at least one shielding line is electrically connected to a sub-power line in the at least one sub-power line that is closest to the shielding line; and/or the at least one shielding line is electrically connected to the power bus through a via hole disposed in the peripheral region.

In some embodiments, the display panel has a display region and a peripheral region. The at least one shielding line is electrically connected to the second power line through a via hole disposed in the peripheral region.

In some embodiments, the display panel has a display region and a peripheral region. The initialization signal line includes at least one sub-initialization signal line located in the display region, and an initialization signal bus located in the peripheral region and electrically connected to the at least one sub-initialization signal line. The at least one sub-initialization signal line is electrically connected to the plurality of pixel driving circuits. The at least one shielding line is electrically connected to the at least one sub-initialization signal line and/or the initialization signal bus.

In some embodiments, a shielding line in the at least one sub-power line is electrically connected to a sub-initialization signal line in the at least one sub-initialization signal line that is closest to the shielding line; and/or the at least one shielding line is electrically connected to the initialization signal bus through a via hole disposed in the peripheral region.

In some embodiments, the at least one shielding line is disposed between a film layer where the first data line and the second data line are located and the substrate.

In some embodiments, the display panel further includes light-shielding patterns. The light-shielding patterns are disposed between a film layer where the plurality of pixel driving circuits are located and the substrate. The at least one shielding line and the light-shielding patterns are made of a same material, and are arranged in a same layer.

In some embodiments, a distance between the first data line and second data line is greater than a distance between the at least one shielding line and the film layer where the first data line and the second data line are located in a thickness direction of the substrate.

In some embodiments, the distance between the at least one shielding line and the film layer where the first data line and the second data line are located in the thickness direction of the substrate is in a range of 0.75 μm to 1 μm, inclusive, and the distance between the first data line and second data line is in a range of 4 μm to 8 μm, inclusive.

In some embodiments, the at least one shielding line is arranged in a same layer as the first data line and the second data line, and is located between the first data line and second data line.

In some embodiments, a parasitic capacitance generated between the first data line and second data line is less than at least one of a capacitance of the first capacitor or a capacitance of the second capacitor.

In some embodiments, the plurality of first data lines and the plurality of second data lines are alternately arranged in a row direction of the plurality of pixel driving circuits, and the first data line and second data line are located between two adjacent columns of pixel driving circuits.

In some embodiments, the first data line and second data line are respectively located on two sides of a same column of pixel driving circuits.

In another aspect, a display device is provided. The display device includes the display panel in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1A:
FIG. 1A is a schematic diagram of a display device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "A and/or B" includes following three combinations: only A, only B, and a combination of A and B.

The use of the phase "applicable to" or "configured to" herein means an open and inclusive expression, which does not exclude devices that are applicable to or configured to perform additional tasks or steps.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

As shown in FIG. 1A, some embodiments of the present disclosure provide a display device. The display device 100 may be a television, a mobile phone, a computer, a notebook computer, a tablet computer, a personal digital assistant (PDA), or a vehicle-mounted computer.

The display device 100 includes a display panel 101. The display panel 101 may be a liquid crystal display (LCD) panel, or the display panel 101 may be an electroluminescent display panel or a photoluminescent display panel. In a case where the display panel 101 is the electroluminescent display panel, the electroluminescent display panel may be an organic light-emitting diode (OLED) display panel or a quantum dot light-emitting diode (QLED) display panel. In a case where the display panel 101 is the photoluminescent display panel, the photoluminescent display panel may be a quantum dot photoluminescent display panel.

The display panel 101 includes a plurality of sub-pixels arranged in an array. A sectional structure of the sub-pixel in the display panel 101 will be described below in an example where the display panel 101 is the OLED display panel.

Figure 1B:
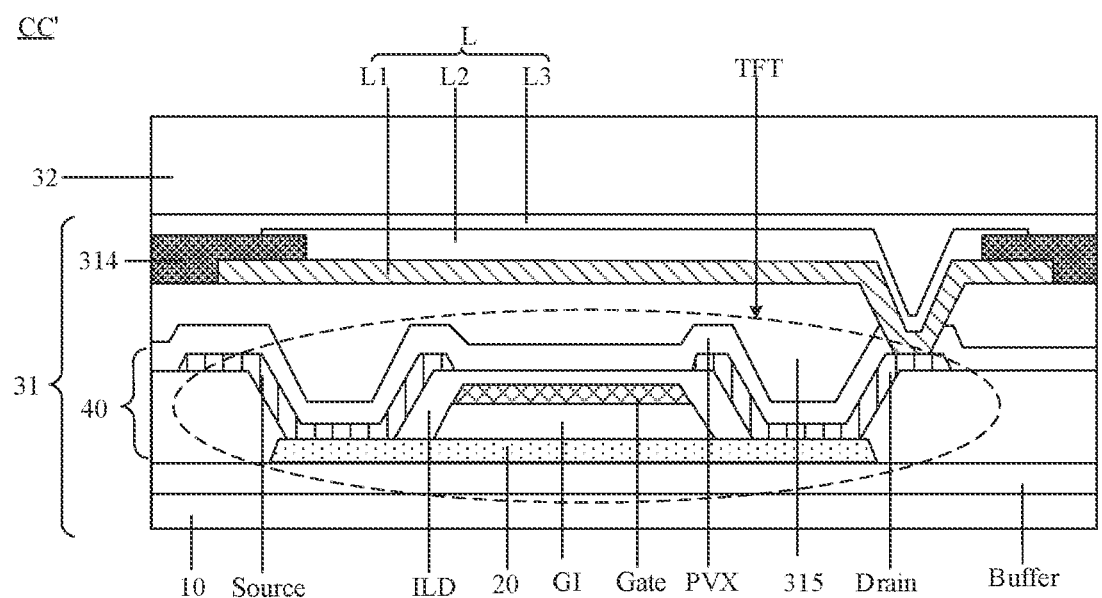
FIG. 1B is a sectional view of the display device shown in FIG. 1A taken along the CC' direction.

As shown in FIG. 1B, the display panel 101 includes a display substrate 31 and an encapsulation layer 32 for encapsulating the display substrate 31. Here, the encapsulation layer 32 may be an encapsulation film or an encapsulation substrate.

As shown in FIG. 1B, each sub-pixel in the display substrate 31 includes a light-emitting device L and a pixel driving circuit 40 that are disposed on a substrate 10, and the pixel driving circuit 40 includes a plurality of thin film transistors TFT. The light-emitting device L includes an anode L1, a light-emitting functional layer L2 and a cathode L3, and the anode L1 is electrically connected to a drain of one of the plurality of thin film transistors TFT.

As shown in FIG. 1B the thin film transistor TFT includes a gate Gate, a source Source, a drain Drain and a semiconductor active layer 20. In some thin film transistors TFT each having a top-gate structure (as shown in FIG. 5B), a self-alignment process is performed by using a gate, and a channel CH, a source contact portion Source' and a drain contact portion Drain' are formed in the semiconductor active layer 20. In this case, the source contact portion Source' is equivalent to a source, and the drain contact portion Drain' is equivalent to a drain.

On this basis, in a thickness direction of the display substrate 31, the display substrate 31 includes a semiconductor layer (i.e., a film layer where semiconductor active layers 20 of thin film transistors TFT in the plurality of sub-pixels are located), a gate conductive layer (i.e., a film layer where gates Gate of thin film transistors TFT in the plurality of sub-pixels are located) and a source-drain conductive layer (i.e., a film layer where sources Source and drains Drain of thin film transistors TFT in the plurality of sub-pixels are located) that are arranged in sequence.

The display substrate 31 further includes a pixel defining layer 314. The pixel defining layer 314 includes a plurality of opening regions, and a light-emitting device L is disposed in an opening region. In some embodiments, the light-emitting functional layer L2 includes a light-emitting layer. In some other embodiments, in addition to the light-emitting layer, the light-emitting functional layer L2 further includes one or more of an electron transport layer (ETL), an electron injection layer (EIL), a hole transport layer (HTL) and a hole injection layer (HIL).

As shown in FIG. 1B, the display substrate 31 further includes a planarization layer 315 disposed between the thin film transistors TFT and the anodes L1 in the plurality of sub-pixels.

In addition, the display substrate 31 may further include a buffer layer Buffer located between the substrate 10 and the semiconductor layer, a gate insulating layer GI located between the semiconductor layer and the gate conductive layer, an interlayer dielectric layer ILD located between the gate conductive layer and the source-drain conductive layer, and a passivation layer PVX located between the source-drain conductive layer and the planarization layer 315. In some embodiments, the display substrate 31 includes two gate conductive layers, i.e., a first gate conductive layer and a second gate conductive layer. In this case, the display substrate 31 includes two gate insulating layers GI, i.e., a first gate insulating layer and a second gate insulating layer. In this case, in the thickness direction of the display substrate 31, the display substrate 31 includes the semiconductor layer, the first gate insulating layer, the first gate conductive layer, the second gate insulating layer, the second gate conductive layer, the interlayer dielectric layer ILD, the source-drain conductive layer, the passivation layer PVX, and the planarization layer 315 that are arranged in sequence.

In a case where the display device 100 is an electroluminescent display device or a photoluminescent display device, the display device 100 may be a top-emission display device. In this case, the anode L1 proximate to the substrate 10 is opaque, and the cathode L3 away from the substrate 10 is transparent or semi-transparent. Alternatively, the display device 100 may be a bottom-emission display device. In this case, the anode L1 proximate to the substrate 10 is transparent or semi-transparent, and the cathode L3 away from the substrate 10 is opaque. Alternatively, the display device 100 may be a double-sided-emission display device. In this case, the anode L1 proximate to the substrate 10 and the cathode L3 away from the substrate 10 are transparent or semi-transparent.

Figure 2A:
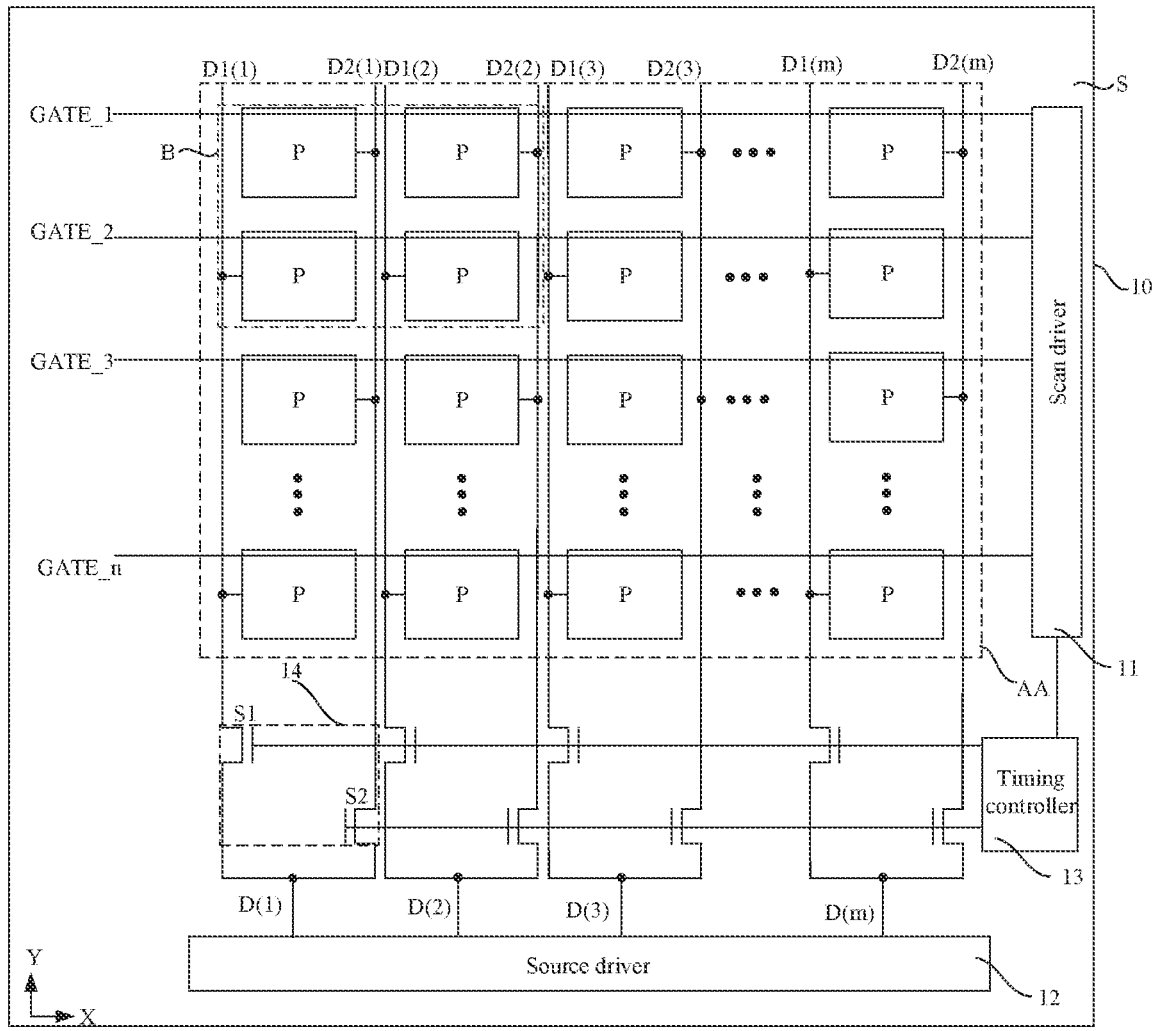
FIG. 2A is a diagram showing a source driving architecture of a display panel, in accordance with some embodiments.
Figure 2B:
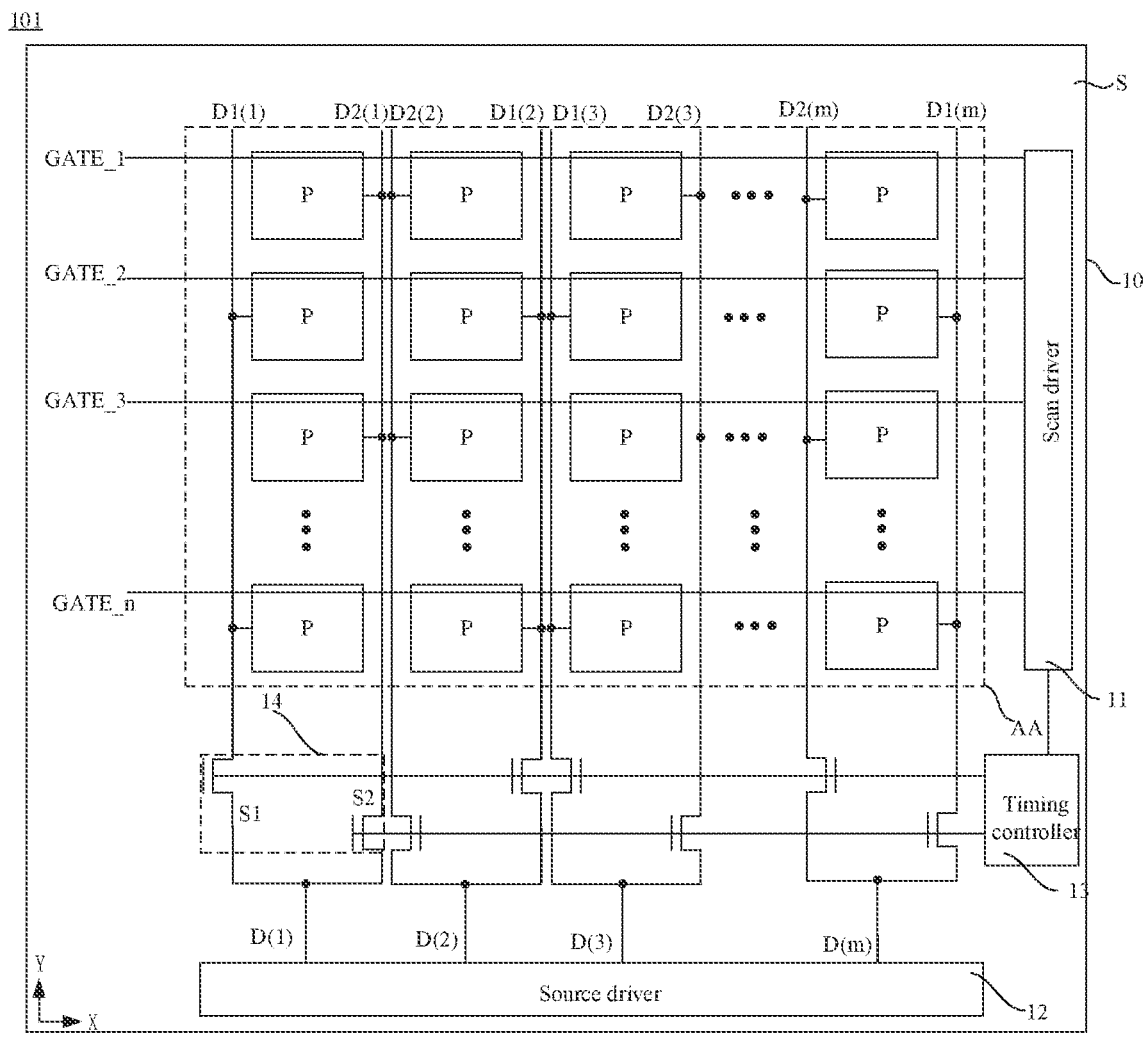
FIG. 2B is a diagram showing a source driving architecture of another display panel, in accordance with some embodiments.

As shown in FIGS. 2A and 2B, in some embodiments, the display panel 101 has a display region (also referred to as active area, AA) and a peripheral region S.

The peripheral region S is located on at least one side of the AA.

For example, the peripheral region S may be arranged around the AA.

The display panel 101 includes the plurality of sub-pixels P located in the AA. The plurality of sub-pixels P include at least sub-pixels of a first color, sub-pixels of a second color and sub-pixels of a third color. The first color, the second color and the third color are three primary colors (e.g., red, green and blue, respectively).

FIGS. 2A and 2B exemplarily illustrate that the plurality of sub-pixels P are arranged in an array of n rows and m columns, where n and m are positive integers, and n is greater than or equal to 2, and m is greater than or equal to 2.

On this basis, each sub-pixel P includes the pixel driving circuit 40 (referring to FIGS. 1A and 1B) and an element to be driven (e.g., the light-emitting device L, referring to FIGS. 1A and 1B, a description will be made below in an example where the element to be driven is the light-emitting device L). The pixel driving circuit 40 is electrically connected to the light-emitting device L corresponding thereto, and the pixel driving circuit 40 is used for driving the light-emitting device L to operate. The light-emitting device L is further electrically connected to a second power line VSS (referring to FIG. 15).

For example, the light-emitting device L may be a micro light-emitting diode (Micro LED), or a mini light-emitting diode (Mini LED), or an organic light-emitting diode (OLED).

In order to increase the time for writing data and compensating for the threshold voltage, a source driving architecture with two data lines is proposed. In this source driving architecture, each column of sub-pixels P is electrically connected to the two data lines. The source driving architecture will be described below.

As shown in FIGS. 2A and 2B, the display panel 101 includes a scan driver 11, a source driver 12, a timing controller 13 and a plurality of gating devices 14 that are all provided in the peripheral region S.

A gating device 14 corresponds to a column of sub-pixels P.

The scan driver 11 is electrically connected to gate lines GATE and the timing controller 13.

It will be understood that as shown in FIGS. 2A and 2B, in a case where the display panel 101 has n rows of sub-pixels P, a gate line GATE_1 electrically connected to pixel driving circuits 40 in a first row of sub-pixels P to a gate line GATE_n electrically connected to pixel driving circuits 40 in an n-th row of sub-pixels P are all electrically connected to the scan driver 11.

The gating devices 14 are electrically connected to the source driver 12 and the timing controller 13.

The gating device 14 is further electrically connected to two data lines that are electrically connected to pixel driving circuits in a same column of sub-pixels P corresponding to the gating device 14.

It will be understood that in a case where the display panel 101 has m columns of sub-pixels, accordingly, the number of the gating devices 14 is m. Each gating device 14 is electrically connected to the source driver 12 through a data bus D, and the number of the data buses is m.

For example, as shown in FIGS. 2A and 2B, a gating device 14 corresponding to a first column of sub-pixels is electrically connected to the source driver 12 through a data bus D(1), a gating device 14 corresponding to a second column of sub-pixels is electrically connected to the source driver 12 through a data bus D(2), and a gating device 14 corresponding to an m-th column of sub-pixels is electrically connected to the source driver 12 through a data bus D(m).

In this case, the pixel driving circuits 40 in the same column of sub-pixels P are electrically connected to a first data line D1 and a second data line D2. The first data line D1 is electrically connected to pixel driving circuits 40 in even-numbered rows of sub-pixels P, and the second data line D2 is electrically connected to pixel driving circuits 40 in odd-numbered rows of sub-pixels P.

It will be understood that in a column of sub-pixels, pixel driving circuits in odd-numbered rows of sub-pixels P are electrically connected to a gating device 14 corresponding to the column of sub-pixels through a second data line D2, and pixel driving circuits in even-numbered rows of sub-pixels P are electrically connected to the gating device 14 corresponding to the column of sub-pixels through a first data line D1.

For example, as shown in FIGS. 2A and 2B, in the first column of sub-pixels P, pixel driving circuits in odd-numbered rows of sub-pixels P are electrically connected to the gating device 14 corresponding to the first column of sub-pixels P through a second data line D2(1), and pixel driving circuits in even-numbered rows of sub-pixels P are electrically connected to the gating device 14 corresponding to the first column of sub-pixels through a first data line D1(1).

In the second column of sub-pixels P, pixel driving circuits in odd-numbered rows of sub-pixels P are electrically connected to the gating device 14 corresponding to the second column of sub-pixels P through a second data line D2(2), and pixel driving circuits in even-numbered rows of sub-pixels P are electrically connected to the gating device 14 corresponding to the second column of the sub-pixels through a first data line D1(2).

In the m-th column of sub-pixels P, pixel driving circuits in odd-numbered rows of sub-pixels P are electrically connected to the gating device 14 corresponding to the m-th column of sub-pixels P through a second data line D2($m$), and pixel driving circuits in even-numbered rows of sub-pixels P are electrically connected to the gating device 14 corresponding to the m-th column of the sub-pixels through a first data line D1($m$).

On this basis, the scan driver 11 is configured to output gate scan signals to respective gate lines GATE row by row under a control of signals from the timing controller 13.

It will be understood that in the case where the display panel has n rows of sub-pixels P, the scan driver 11 outputs the gate scan signals row by row from a first row to an n-th row (i.e., GATE_1 to GATE_n) under the control of the signals from the timing controller 13.

The source driver 12 is configured to output data signals to respective gating devices 14 under a control of signals from the timing controller 13.

The gating device 14 is configured to, under the control of the signals from the timing controller 13, at different time periods, transmit a data signal from the source driver 12 to the first data line D1 of the two data lines that are electrically connected to the pixel driving circuits 40 in the same column of sub-pixels P corresponding to the gating device 14, and to the second data line D2 of the two data lines that are electrically connected to the pixel driving circuits 40 in the same column of sub-pixels P corresponding to the gating device 14.

It will be understood that for the m-th column of sub-pixels P, when data is written into the odd-numbered rows of sub-pixels P, the gating device 14 transmits a data signal from the source driver 12 to the second data line D2(m) electrically connected to the gating device 14 under a control of the timing controller 13, so that the data is written into the odd-numbered rows of sub-pixels P electrically connected to the data bus D(m). When data is written into the even-numbered rows of sub-pixels P, the gating device 14 transmits the data signal from the source driver 12 to the first data line D1(m) electrically connected to the gating device 14 under the control of the timing controller 13, so that the data is written into the even-numbered rows of sub-pixels P electrically connected to the data bus D(m).

In some embodiments of the present disclosure, as shown in FIGS. 2A and 2B, the gating device 14 includes a first transistor S1 and a second transistor S2. A gate of the first transistor S1 is electrically connected to the timing controller 13, a first electrode of the first transistor S1 is electrically connected to the data bus D corresponding to the gating device 14, and a second electrode of the first transistor S1 is electrically connected to the first data line D1 that is electrically connected to the pixel driving circuits 40 in the same column of the sub-pixels P corresponding to the gating device 14. A gate of the second transistor S2 is electrically connected to the timing controller 13, a first electrode of the second transistor S2 is electrically connected to the data bus D corresponding to the gating device 14, and a second electrode of the second transistor S2 is electrically connected to the second data line D2 that is electrically connected to the pixel driving circuits 40 in the same column of sub-pixels P corresponding to the gating device 14.

For example, for the m-th column of sub-pixels, the second electrode of the first transistor S1 is electrically connected to the first data line D1(m) that is electrically connected to the even-numbered rows of sub-pixels P and the second electrode of the second transistor S2 is electrically connected to the second data line D2(m) that is electrically connected to the odd-numbered rows of sub-pixels P. When the data is written into the odd-numbered rows of sub-pixels P, under the control of the timing controller 13, the second transistor S2 is turned on, and the first transistor S1 is turned off, so that the data signal from the source driver 12 is transmitted to the second data line D2(m) electrically connected to the second transistor S2 through the second transistor S2, and the data is written into the odd-numbered rows of sub-pixels P electrically connected to the second data line D2(m). When the data is written into the even-numbered rows of sub-pixels P, under the control of the timing controller 13, the first transistor S1 is turned on, and the second transistor S2 is turned off, so that the data signal from the source driver 12 is transmitted to the first data line D1(m) electrically connected to the first transistor S1 through the first transistor S1 and the data is written into the even-numbered rows of sub-pixels P electrically connected to the first data line D1(m).

Figure 3:
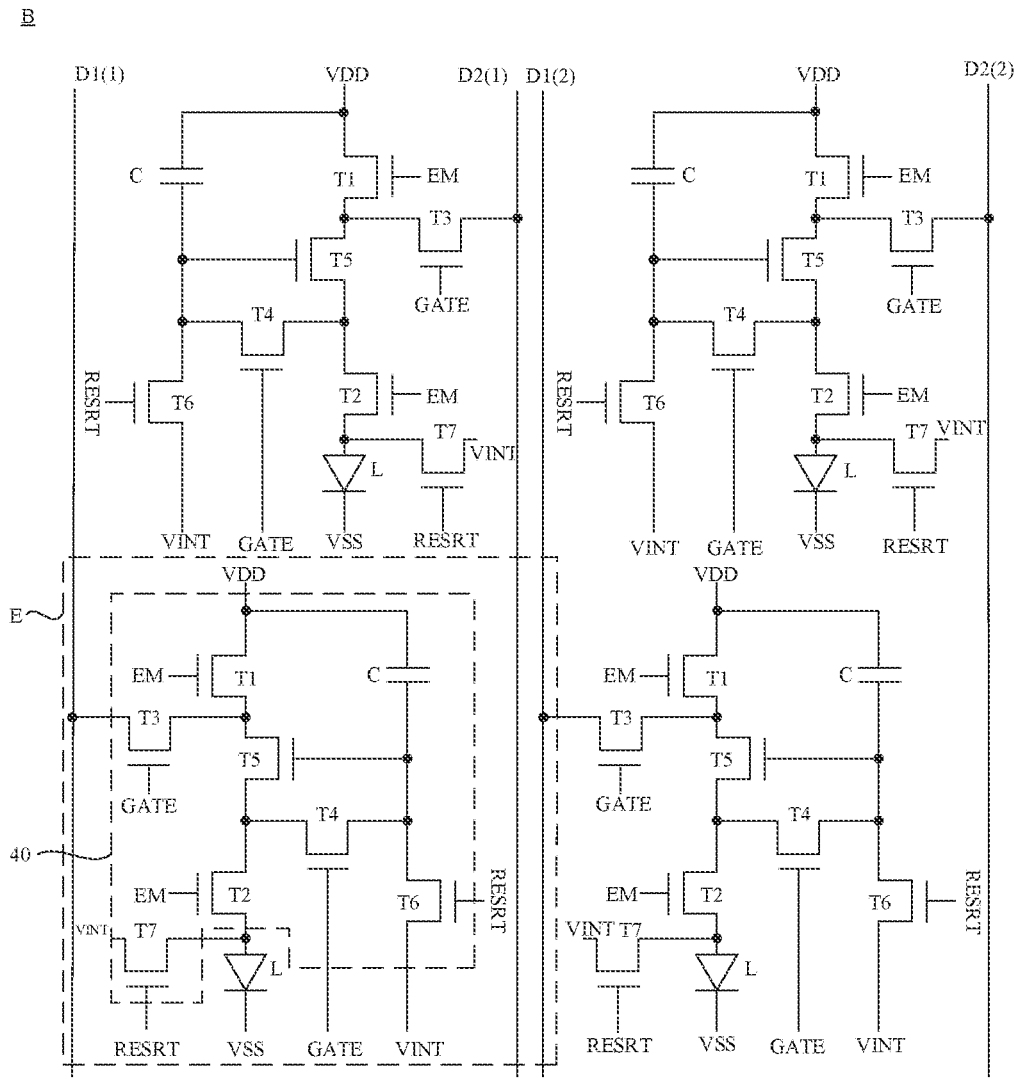
FIG. 3 is a circuit diagram of the B region in FIG. 2A.

FIG. 3 is a structural diagram of pixel driving circuits 40 corresponding to the region B in FIG. 2A. FIG. 3 exemplarily illustrates that the pixel driving circuit 40 has a 7T1C (i.e., seven transistors and a storage capacitor) structure. The pixel driving circuit 40 includes a first transistor T1, a second transistor T2, a third transistor T3, a fourth transistor T4, a fifth transistor T5, a sixth transistor T6, a seventh transistor T7 and a storage capacitor C, and the fifth transistor T5 is a driving transistor.

Figure 4A:
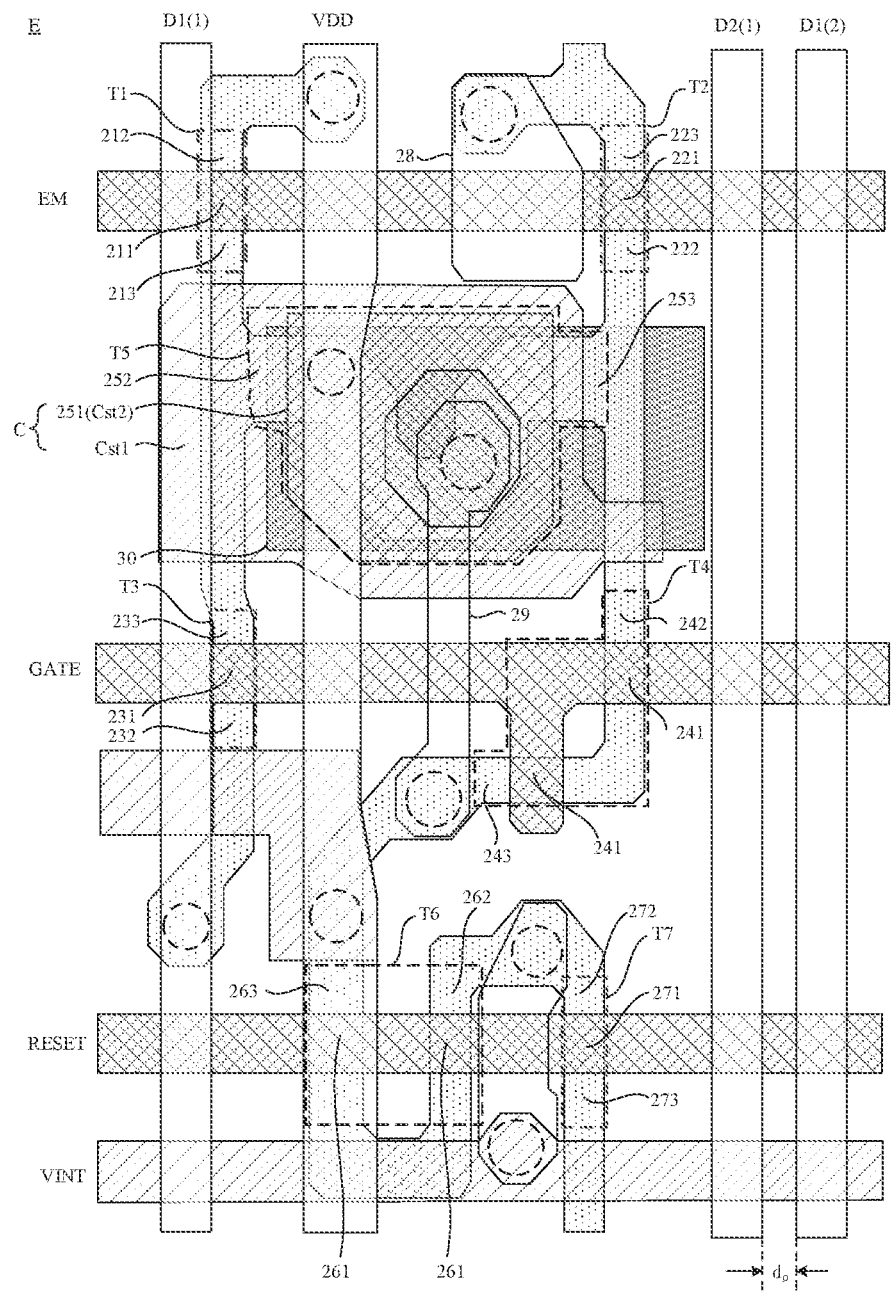
FIG. 4A is a structural diagram corresponding to the E region in FIG. 3.

FIG. 4A is a layout diagram corresponding to the pixel driving circuit 40 in the E region in FIG. 3. A gate 211 of the first transistor T1 is electrically connected to an enable signal line EM, a first electrode 212 of the first transistor T1 is electrically connected to a first power line VDD and a first electrode Cst1 of the storage capacitor C, and a second electrode 213 of the first transistor T1 is electrically connected to a second electrode 233 of the third transistor T3 and a first electrode 252 of the fifth transistor T5.

A gate 221 of the second transistor T2 is electrically connected to the enable signal line EM, and a first electrode 222 of the second transistor T2 is electrically connected to a first electrode 242 of the fourth transistor T4 and a second electrode 253 of the fifth transistor T5.

A gate 231 of the third transistor T3 is electrically connected to the gate line GATE, and a first electrode 232 of the third transistor T3 is electrically connected to the first data line D1.

The fourth transistor T4 is a double-gate transistor. A gate 241 of the fourth transistor T4 is electrically connected to the gate line GATE, and a second electrode 243 of the fourth transistor T4 is electrically connected to a second electrode Cst2 of the storage capacitor C through a second connection electrode 29. The fourth transistor T4 is configured to compensate for a threshold voltage of the fifth transistor T5.

A gate 261 of the sixth transistor T6 is electrically connected to a reset signal line RESET, a first electrode 262 of the sixth transistor T6 is electrically connected to an initialization signal line VINT, and a second electrode 263 of the sixth transistor T6 is electrically connected to the second electrode Cst2 of the storage capacitor C. The sixth transistor T6 is configured to initialize the second electrode Cst2 of the storage capacitor C and gate 251 of the fifth transistor T5 through the initialization signal line VINT under a control of the reset signal line RESET.

The second electrode Cst2 of the storage capacitor C serves as the gate 251 of the fifth transistor T5, and the first electrode Cst1 of the storage capacitor C is connected to the first power line VDD through a via hole.

The pixel driving circuit 40 is configured to drive the light-emitting device L to operate (referring to FIG. 3). A first electrode of the light-emitting device L is electrically connected to a first connection electrode 28 (referring to FIG. 4A) through a via hole, and a second electrode of the light-emitting device L is electrically connected to the second power line VSS. The first connection electrode 28 is electrically connected to a second electrode 223 of the second transistor T2 through a via hole.

A gate 271 of the seventh transistor T7 is electrically connected to the reset signal line RESET, a first electrode 272 of the seventh transistor T7 is electrically connected to the initialization signal line VINT, and a second electrode 273 of the seventh transistor T7 is electrically connected to the first electrode of the light-emitting device L. The seventh transistor T7 is configured to initialize the first electrode of the light-emitting device L through the initialization signal line VINT under the control of the reset signal line RESET.

It will be noted that a first electrode of each transistor included in the pixel driving circuit 40 is one of a source and a drain of the transistor, and a second electrode of the transistor is another one of the source and the drain of the transistor. Since a source and a drain of a transistor may be symmetrical in structure, the source and the drain of the transistor may be same in structure. That is, the first electrode and the second electrode of the transistor in the embodiments of the present disclosure may be same in structure. For example, in a case where the transistor is a P-type transistor, the first electrode of the transistor is a source, and the second electrode of the transistor is a drain. For example, in a case where the transistor is an N-type transistor, the first electrode of the transistor is a drain, and the second electrode of the transistor is a source.

As shown in FIGS. 4A, 5A, 5A, 7A, 8A and 9A, in some embodiments, the display panel 101 further includes light-shielding patterns 30, and an orthographic projection of a light-shielding pattern 30 on the substrate 10 covers an orthographic projection of a semiconductor active layer 20 of the fifth transistor T5 (i.e., the driving transistor) on the substrate 10. For example, the light-shielding patterns 30 are made of metal. A performance of the driving transistor has a great effect on a performance of the pixel driving circuit 40, and by providing the light-shielding pattern 30, light incident on the pixel driving circuit 40 from the outside may be prevented from affecting the driving transistor, so as to ensure a stability of the driving transistor.

In the above source driving architecture with the two data lines, a parasitic capacitance formed between adjacent data lines is large. Therefore, a variation in signal of a data line easily affects a signal of another data line adjacent to the data line and in a floating state, thereby causing lateral crosstalk and poor display.

Here, the adjacent data lines are, for example, the first data line D1 and the second data line D2 that are arranged adjacent to each other. The first data line D1 and the second data line D2 arranged adjacent to each other include following cases. In a first case, as shown in FIG. 2A, the first data line D1 and the second data line D2 are located between two adjacent columns of sub-pixels P, and the two data lines are electrically connected to corresponding sub-pixels P in respective columns of sub-pixels P. In a second case, as shown in FIG. 2B, the first data line D1 and the second data line D2 are respectively located on two sides of a same column of sub-pixels P, and the two data lines are each electrically connected to corresponding sub-pixels P in the same column of sub-pixels P.

As shown in FIG. 2A, in some embodiments, a plurality of first data lines (i.e., D1(1) to D1(m)) and a plurality of second data lines (i.e., D2(1) to D2(m)) are alternately arranged in a row direction of the pixel driving circuits 40, i.e., in a row direction of the sub-pixels P. Two adjacent columns of sub-pixels P are provided with a first data line D1 and a second data line D2 therebetween.

It will be noted that as shown in FIGS. 2A and 2B, the row direction is an X direction, and a column direction is a Y direction.

As shown in FIG. 2A, the first data line D1(1) is disposed on a left side of a first column of pixel driving circuits 40, and the second data line D2(1) is disposed on a right side of the first column of pixel driving circuits 40. The first data line D1(2) is disposed on a left side of a second column of pixel driving circuits 40, and the second data line D2(2) is disposed on a right side of the second column of pixel driving circuits 40. The second data line D2(1) and the first data line D1(2) are arranged adjacent to each other between the first column of pixel driving circuits 40 and the second column of pixel driving circuits 40. By analogy, the first data line D1(m−1) is disposed on a left side of an (m−1)-th column of pixel driving circuits 40, and the second data line D2(m−1) is disposed on a right side of the (m−1)-th column of pixel driving circuits 40. The first data line D1(m) is disposed on a left side of an m-th column of pixel driving circuits 40, and the second data line D2(m) is disposed on a right side of the m-th column of pixel driving circuits 40. The second data line D2(m−1) and the first data line D1(m) are arranged adjacent to each other between the (m−1)-th column of pixel driving circuits 40 and the m-th column of pixel driving circuits 40.

Figure 4B:
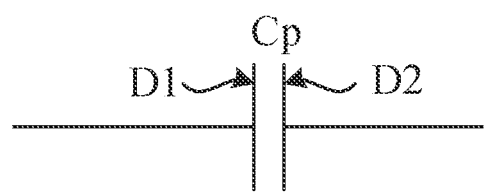
FIG. 4B is an equivalent circuit diagram corresponding to a first data line and a second data line in FIG. 4A.

On this basis, the first data line D1 and the second data line D2 arranged adjacent to each other are arranged in parallel. The first data line D1 and the second data line D2 have an overlapping area therebetween, and portions, which have the overlapping area, of the first data line D1 and the second data line D2 that are adjacent to each other constitutes a parasitic capacitor Cp as shown in FIG. 4B. That is, the first data line D1 and the second data line D2 serve as two electrode plates of the parasitic capacitor Cp, respectively. An insulating layer between the first data line D1 and the second data line D2 serves as a dielectric of the parasitic capacitor Cp. A capacitance of the parasitic capacitor Cp is $$Cp = \frac{\varepsilon_{rp1} S_p}{4\pi k d_p}.$$

Here, $\varepsilon_{rp1}$ is a relative dielectric constant of the insulating layer between the first data line D1 and the second data line D2, $S_p$ is the overlapping area between the first data line D1 and the second data line D2, $d_p$ is a distance between surfaces of the first data line D1 and the second data line D2 that are proximate to each other, k is the electrostatic force constant, and π is the circular constant (i.e., pi).

Similarly, as shown in FIG. 2B, in some embodiments, for another source driving architecture with two data lines, two data lines disposed between two adjacent columns of sub-pixels P are the first data lines D1 or the second data lines D2.

As shown in FIG. 2B, the first data line D1(1) is disposed on the left side of the first column of pixel driving circuits 40, and the second data line D2(1) is disposed on the right side of the first column of pixel driving circuits 40. The second data line D2(2) is disposed on the left side of the second column of pixel driving circuits 40, and the first data line D1(2) is disposed on the right side of the second column of pixel driving circuits 40. By analogy, the first data line D1(m−1) is disposed on the left side of the (m−1)-th column of pixel driving circuits 40, and the second data line D2(m−1) is disposed on the right side of the (m−1)-th column of pixel driving circuits 40. The second data line D2(m) is disposed on the left side of the m-th column of pixel driving circuits 40, and the first data line D1(m) is disposed on the right side of the m-th column of pixel driving circuits 40.

On this basis, the first data line D1 and the second data line D2 that are respectively disposed on two sides of a same column of pixel driving circuits 40 are arranged in parallel. The first data line D1 and the second data line D2 have an overlapping area therebetween, portions, which have the overlapping area, of the first data line D1 and the second data line D2 constitutes a parasitic capacitor Cp as shown in FIG. 4B. That is, the first data line D1 and the second data line D2 serve as two electrode plates of the parasitic capacitor Cp, respectively. An insulating layer and the pixel driving circuits 40 between the first data line D1 and the second data line D2 serve as a dielectric of the parasitic capacitor Cp. A capacitance of the parasitic capacitor Cp is $$Cp = \frac{\varepsilon_{rp2} S_p}{4\pi k d_p}.$$

Here, $\varepsilon_{rp2}$ is a relative dielectric constant of the insulating layer and the pixel driving circuits 40 between the first data line D1 and the second data line D2, $S_p$ is the overlapping area between the first data line D1 and the second data line D2, $d_p$ is a distance between surfaces of the first data line D1 and the second data line D2 that are proximate to each other, k is the electrostatic force constant, and $\pi$ is the circular constant (i.e., pi).

It will be noted that the capacitance of the parasitic capacitor Cp is a parasitic capacitance. That is, no capacitance is originally designed between the first data line D1 and second data line D2 that are adjacent to each other. However, since a mutual capacitance exists between the first data line D1 and second data line D2 that are adjacent to each other, the parasitic capacitance is generated between the first data line D1 and the second data line D2 that are adjacent to each other.

FIG. 4B illustrates an equivalent circuit diagram of the parasitic capacitor Cp formed between the first data line D1 and the second data line D2.

Base on the above, after the data is written into the odd-numbered rows of sub-pixels P through the second data line D2, the second data line D2 is in a floating state. Since a parasitic capacitor Cp is formed between the second data line D2 and other layer in the display panel 101, the parasitic capacitor Cp continues to write data into the odd-numbered rows of sub-pixels P, so as to increase the time for writing data. Moreover, the parasitic capacitor Cp writes data into the even-numbered rows of sub-pixels P through the first data line D1. That is, in this case, a potential of the first data line D1 jumps by $\Delta V$.

In this case, when the first data line D1 writes the data into the even-numbered rows of sub-pixels F, due to an action of the parasitic capacitor Cp formed between the first data line D1 and the second data line D2, a potential of the second data line D2 in the floating state is also affected, and jumps by $\Delta V$.

Similarly, when the second data line D2 writes the data into the odd-numbered rows of sub-pixels F, the potential of the first data line D1 in a floating state also jumps due to an influence of the variation of the potential of the second data line D2, thereby causing the lateral crosstalk and the poor display.

In order to solve the above problems, as shown in FIGS. 5A, 6A, 7A, 8A and 9A, some embodiments of the present disclosure provide the display panel. The display panel 101 includes a plurality of pixel driving circuits 40 arranged in an array, the plurality of first data lines D1, the plurality of second data lines D2 and at least one shielding line LS.

The first data line D1 is electrically connected to pixel driving circuits 40 in even-numbered rows in a same column of pixel driving circuits 40 (i.e., a same column of sub-pixels P).

The second data line D2 is electrically connected to pixel driving circuits 40 in odd-numbered rows in a same column of pixel driving circuits 40 (i.e., a same column of sub-pixels P).

The parasitic capacitor Cp is formed between the first data line D1 and the second data line D2 that are adjacent to each other.

The shielding line LS is configured to transmit a fixed voltage. For example, the fixed voltage is directly applied to the shielding line LS. Alternatively, the shielding line LS is electrically connected to a signal line (e.g., the initialization signal line VINT) originally in the display panel for transmitting the fixed voltage. Alternatively, the shielding line LS is electrically connected to a fixed potential terminal U for transmitting the fixed voltage. The fixed voltage may be 0V, 5V or 15V, as long as the voltage remains unchanged during an operation of the display panel 101, and a value of the fixed voltage is not required.

Figure 5A:
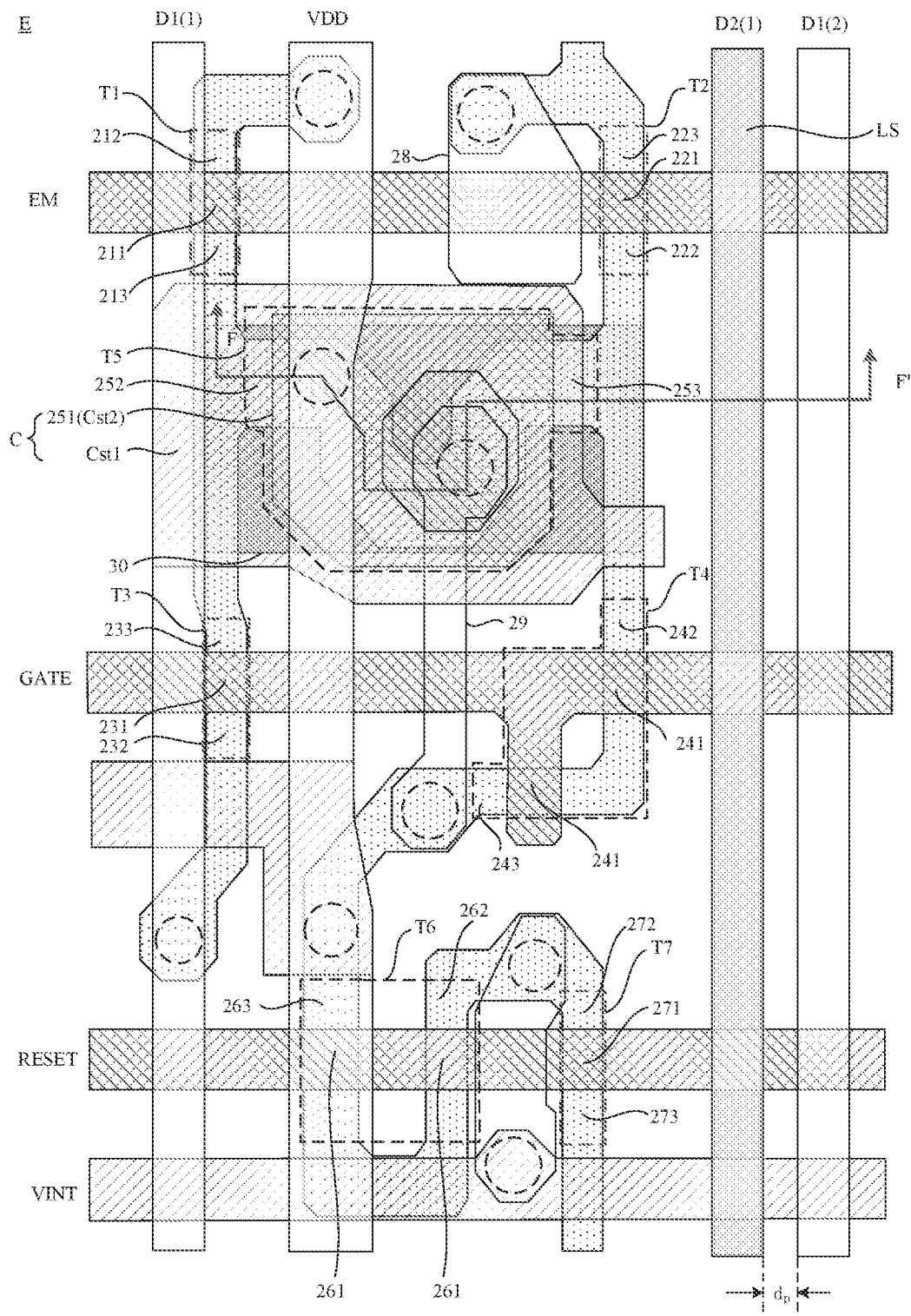
FIG. 5A is another structural diagram corresponding to the E region in FIG. 3.
Figure 5B:
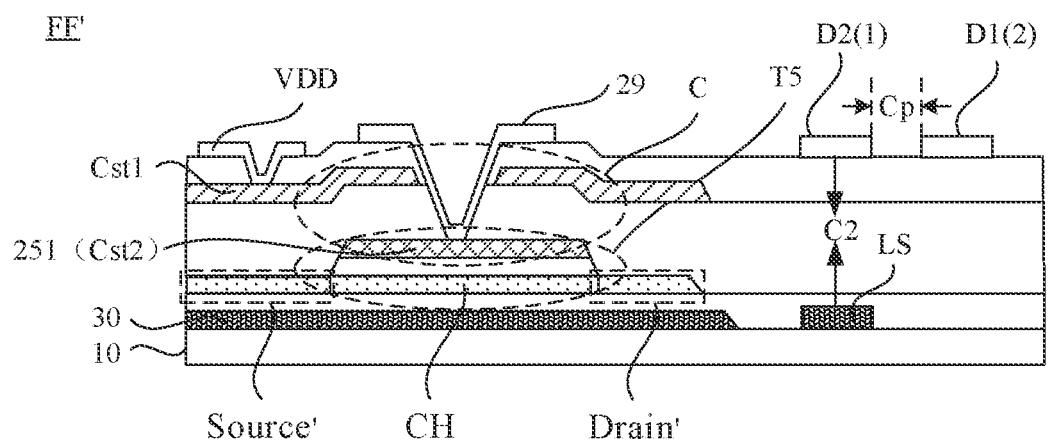
FIG. 5B is a sectional view taken along the FF' direction in FIG. 5A.
Figure 5C:
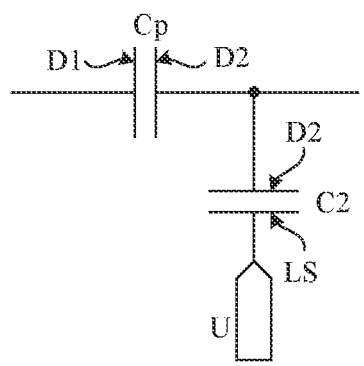
FIG. 5C is an equivalent circuit diagram corresponding to a first data line, a second data line and a shielding line in FIG. 5A.

Referring to FIGS. 5A, 5B and 5C, a shielding line LS constitutes a second capacitor C2 with the second data line in the first data line D1 and the second data line D2 that are adjacent to each other.

Figure 6A:
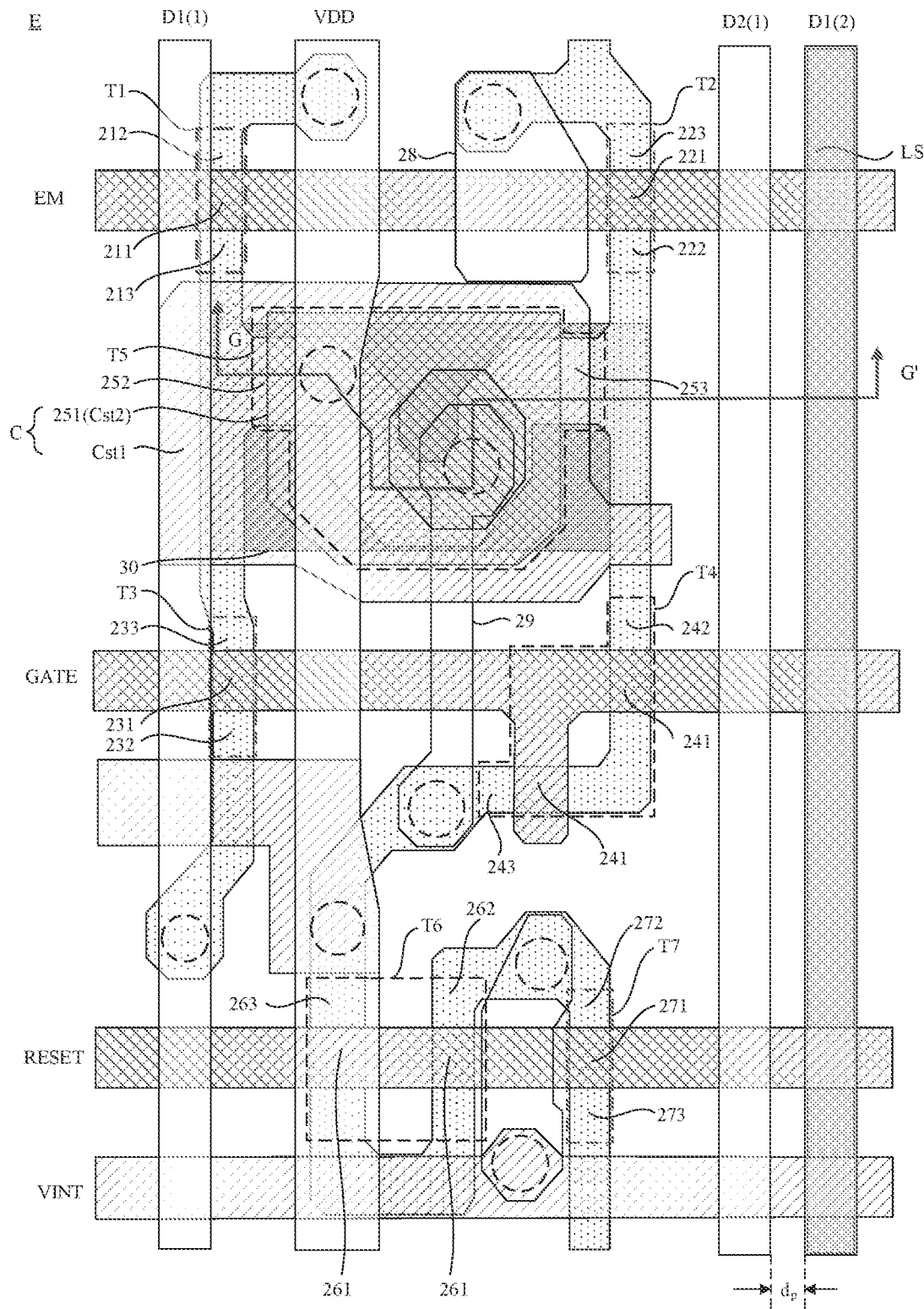
FIG. 6A is yet another structural diagram corresponding to the E region in FIG. 3.
Figure 6B:
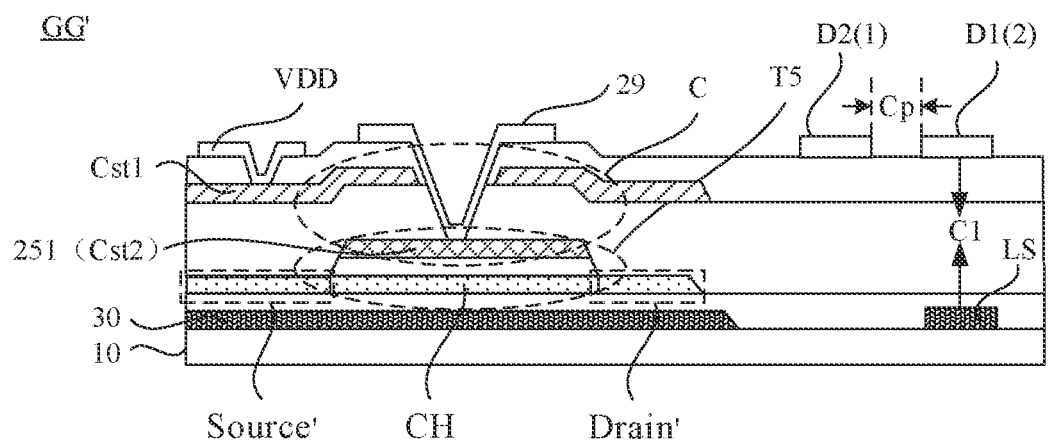
FIG. 6B is a sectional view taken along the GG' direction in FIG. 6A.
Figure 6C:
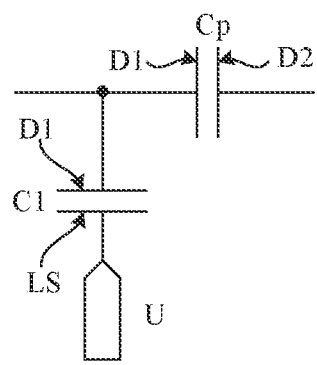
FIG. 6C is an equivalent circuit diagram corresponding to a first data line, a second data line and a shielding line in FIG. 6A.

Referring to FIGS. 6A, 6B and 6C, a shielding line LS constitutes a first capacitor C1 with the first data line D1 in the first data line D1 and the second data line D2 that are adjacent to each other.

Figure 7A:
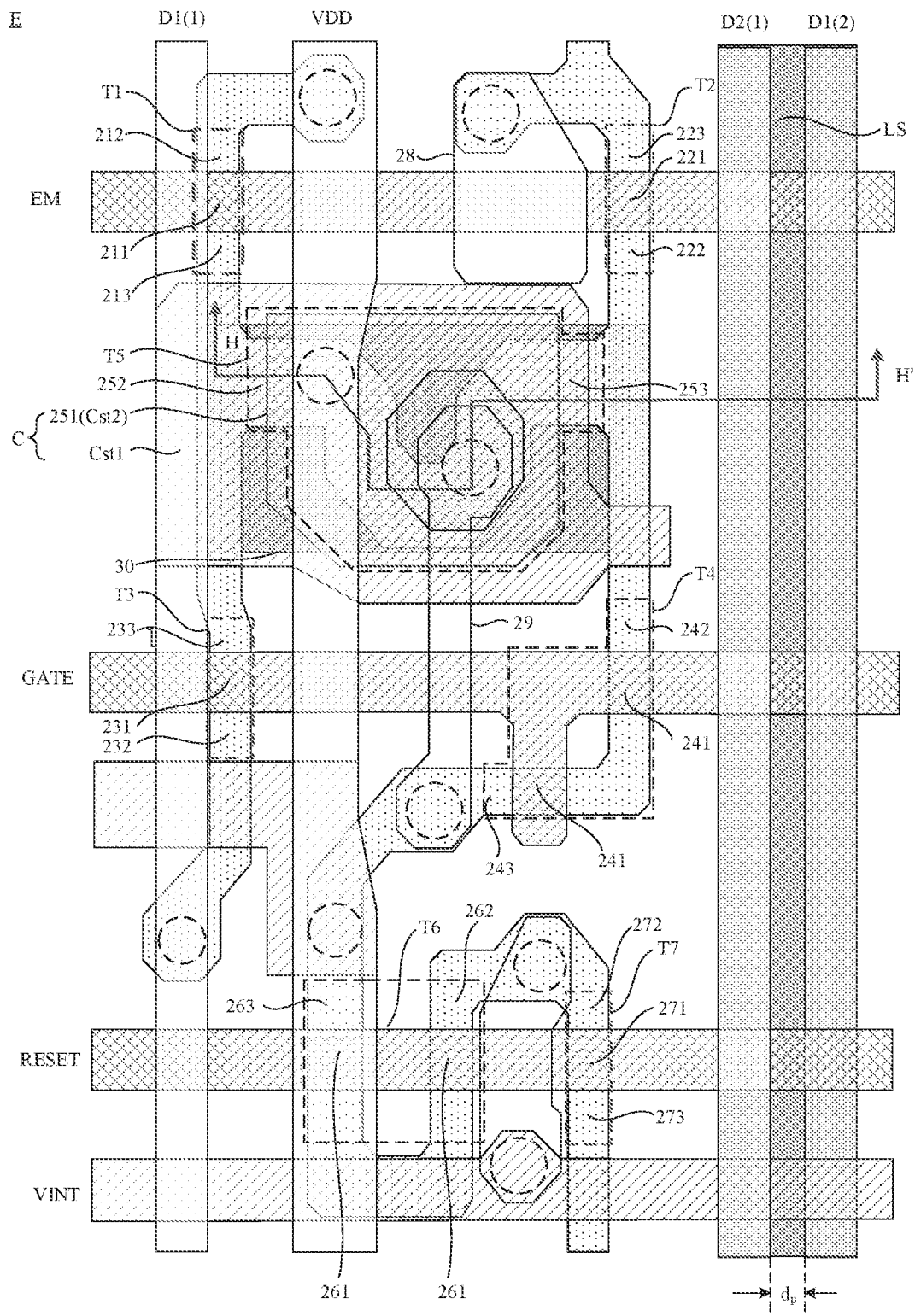
FIG. 7A is yet another structural diagram corresponding to the E region in FIG. 3.
Figure 7B:
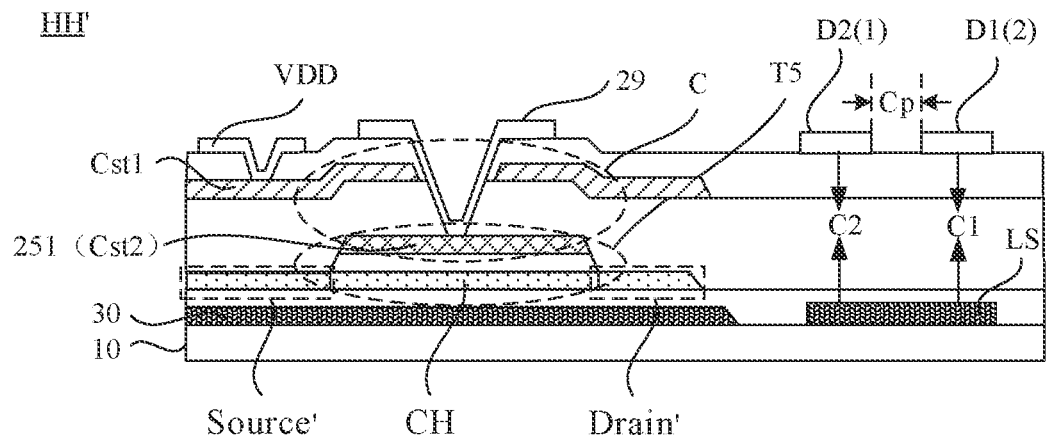
FIG. 7B is a sectional view taken along the HH' direction in FIG. 7A.
Figure 7C:
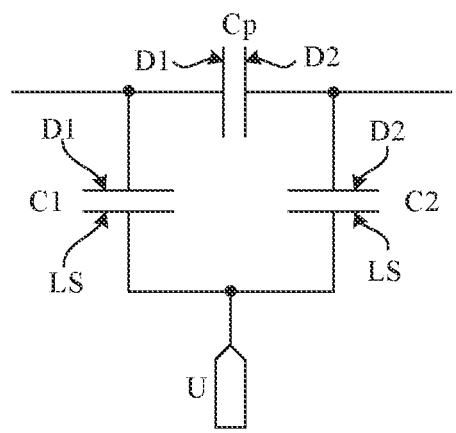
FIG. 7C is an equivalent circuit diagram corresponding to a first data line, a second data line and shielding line(s) in FIG. 7A.

Referring to FIGS. 7A, 7B and 7C, a same shielding line LS constitutes a first capacitor C1 with the first data line in the first data line D1 and the second data line D2 that are adjacent to each other, and constitutes a second capacitor C2 with the second data line D2 in the first data line D1 and the second data line D2 that are adjacent to each other.

Figure 8A:
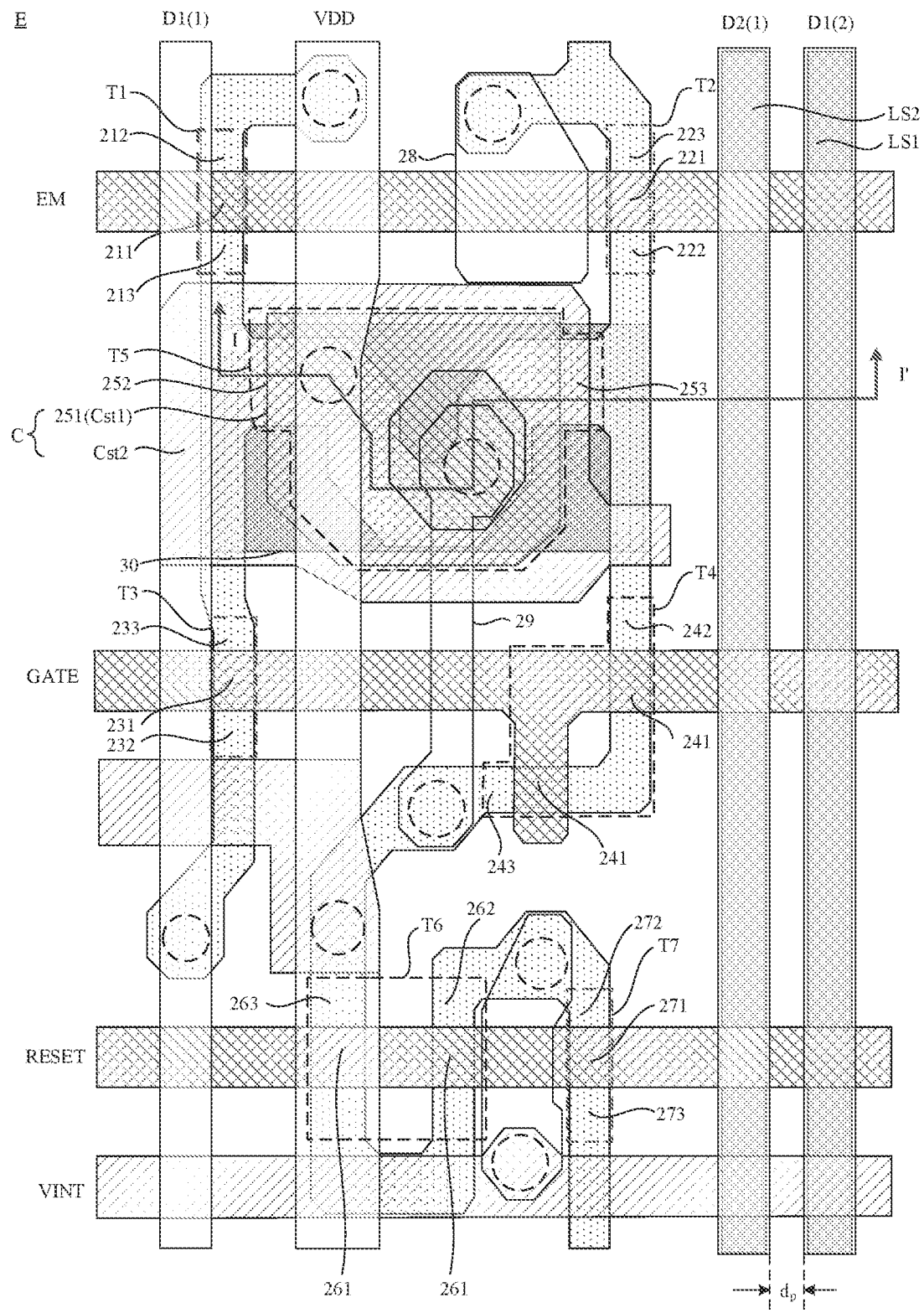
FIG. 8A is yet another structural diagram corresponding to the E region in FIG. 3.
Figure 8B:
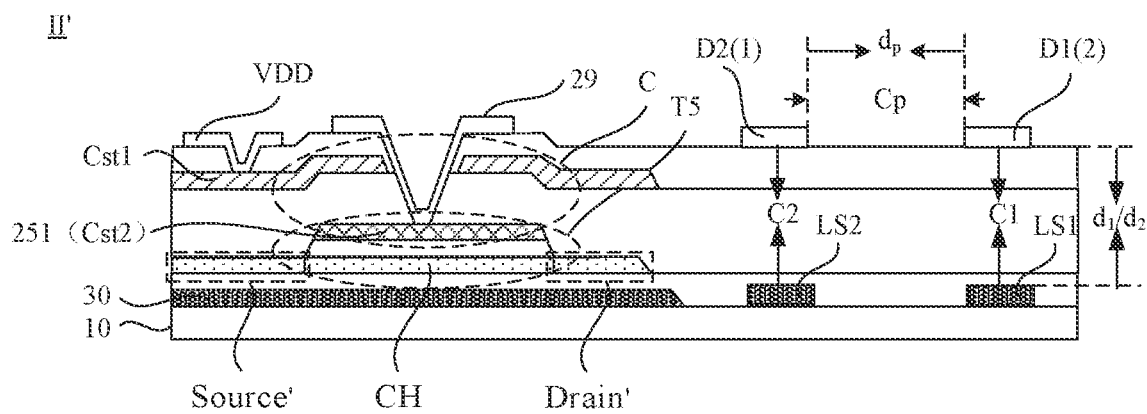
FIG. 8B is a sectional view taken along the II' direction in FIG. 8A.

Referring to FIGS. 8A, 8B and 8C, there are two shielding lines LS, i.e., a first shielding line LS1 and a second shielding line LS2. The first shielding line LS1 constitutes a first capacitor C1 with the first data line D1 in the first data line D1 and the second data line D2 that are adjacent to each other, and the second shielding line LS2 constitutes a second capacitor C2 with the second data line D2 in the first data line D1 and the second data line D2 that are adjacent to each other.

Figure 9A:
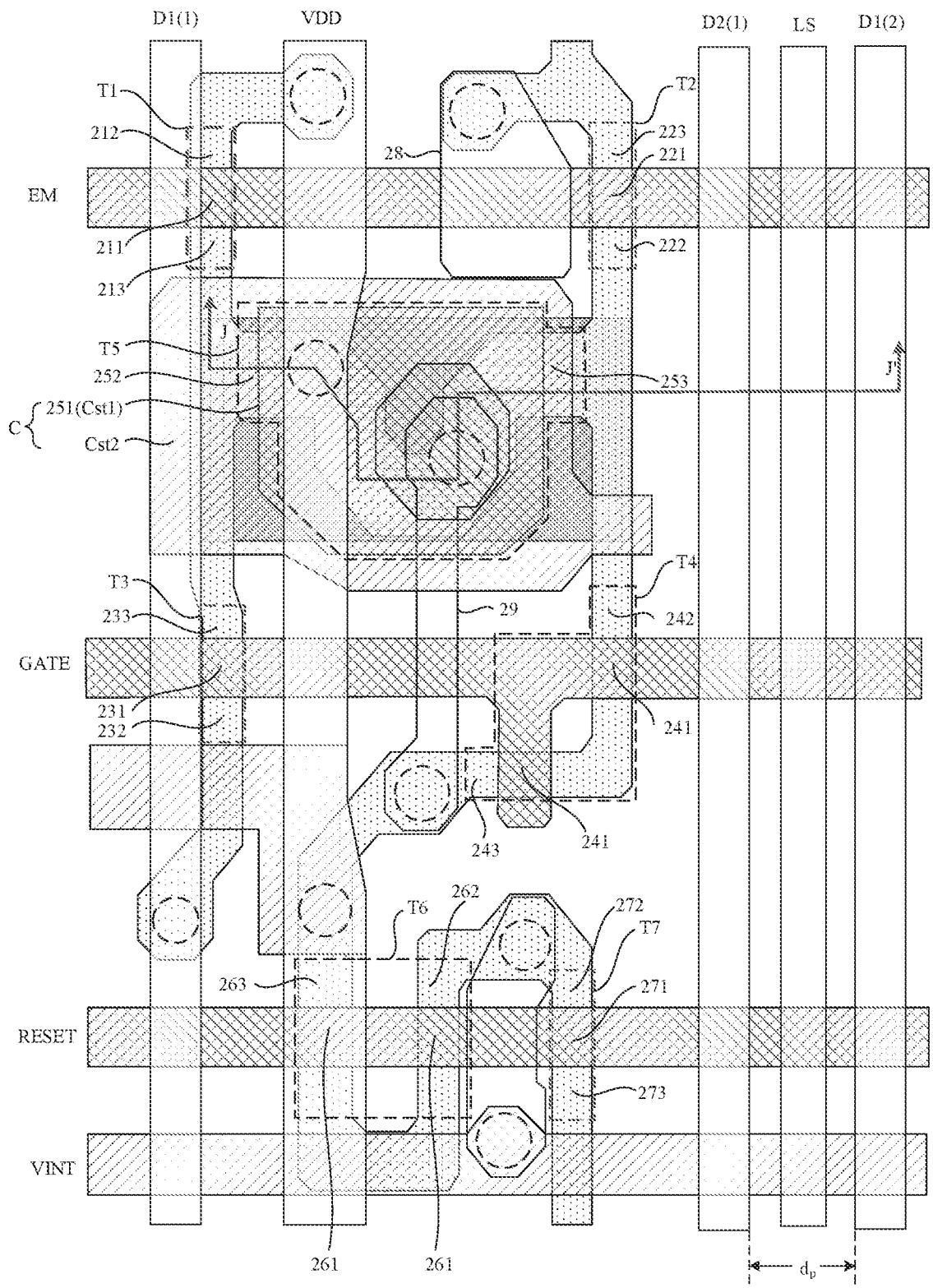
FIG. 9A is yet another structural diagram corresponding to the E region in FIG. 3.
Figure 9B:
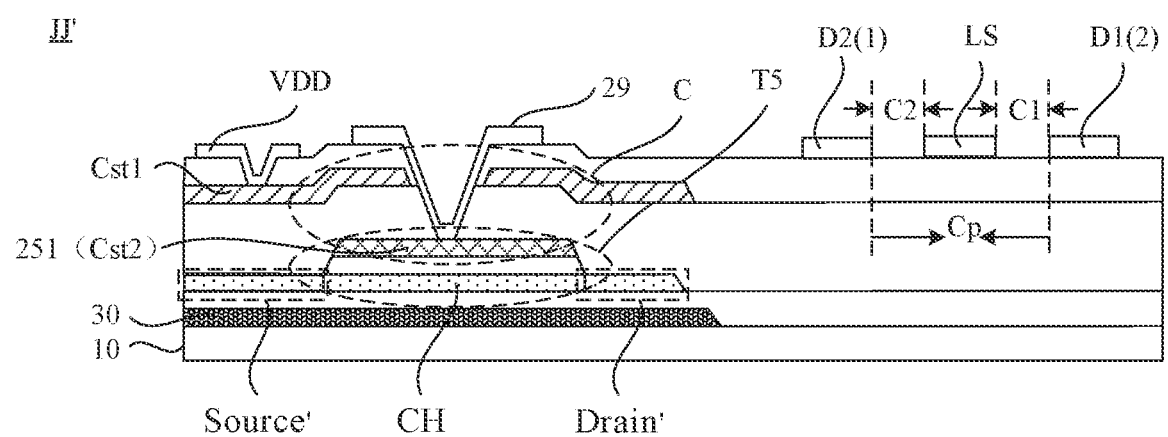
FIG. 9B is a sectional view taken along the JJ' direction in FIG. 9A.

Referring to FIGS. 9A and 9B, a shielding line LS is arranged in the same layer as the first data line D1 and the second data line D2, and is disposed between the first data line D1 and the second data line D2. The same shielding line LS constitutes a first capacitor C1 with the first data line in the first data line D1 and the second data line D2 that are adjacent to each other, and constitutes a second capacitor C2 with the second data line D2 in the first data line D1 and the second data line D2 that are adjacent to each other.

As shown in FIG. 5C, after the data is written into the odd-numbered rows of sub-pixels P through the second data line D2, when the data is written into the even-numbered rows of sub-pixels P through the first data line D1 the potential of the first data line D1 jumps. That is, a potential of a first electrode plate of the parasitic capacitor Cp jumps by $\Delta V$. By providing the shielding line LS corresponding to the second data line D2 and electrically connecting the shielding line LS to the fixed potential terminal U, an equivalent circuit diagram of the parasitic capacitor Cp, the second capacitor C2 constituted by the shielding line LS and the second data line D2, and the fixed potential terminal U is as shown in FIG. 5C. In this case, the parasitic capacitor Cp and the second capacitor C2 are connected in series, and a second electrode plate of the parasitic capacitor Cp serves as a first electrode plate of the second capacitor C2. When the potential of the first electrode plate of the parasitic capacitor Cp jumps by A V, based on the voltage division principle of capacitance, a potential jump of the second electrode plate of the parasitic capacitor Cp is [Cp/(Cp+C2)] ΔV, which is less than ΔV (i.e., [Cp/(Cp+C2)]ΔV<ΔV). That is, a potential jump of the second data line D2 is [Cp/(Cp+C2)]ΔV. Therefore, it is possible to reduce an influence on the potential of the second data line D2, thereby reducing the lateral crosstalk and improving the poor display.

As shown in FIG. 6C, based on the voltage division principle of capacitance, after the data is written into the odd-numbered rows of sub-pixels P through the second data line D2, when the data is written into the even-numbered rows of sub-pixels P through the first data line D1, the potential of the second data line D2 jumps. That is, the potential of the second electrode plate of the parasitic capacitor Cp jumps by ΔV. By providing the shielding line LS corresponding to the first data line D1 and electrically connecting the shielding line LS to the fixed potential terminal U, an equivalent circuit diagram of the parasitic capacitor Cp, the first capacitor C1 constituted by the shielding line LS and the first data line D1, and the fixed potential terminal U is as shown in FIG. 6C. In this case, the parasitic capacitor Cp and the first capacitor C1 are connected in series, and a first electrode plate of the parasitic capacitor Cp serves as a first electrode plate of the first capacitor C1. When the potential of the second electrode plate of the parasitic capacitor Cp jumps by ΔV, based on the voltage division principle of capacitance, a potential jump of the first electrode plate of the parasitic capacitor Cp is [Cp/(Cp+C1)]ΔV, which is less than ΔV (i.e., [Cp/(Cp+C1)] ΔV<ΔV). That is, a potential jump of the first data line D1 is [Cp/(Cp+C1)]ΔV. Therefore, it is possible to reduce an influence on the potential of the first data line D1, thereby reducing the lateral crosstalk and improving the poor display.

As shown in FIG. 7C, the shielding line LS constitutes the first capacitor C1 with the first data line D1 in the first data line D1 and the second data line D2 that are adjacent to each other, and constitutes the second capacitor C2 with the second data line D2 in the first data line D1 and the second data line D2 that are adjacent to each other. That is, the same shielding line LS corresponds to a group of first data line D1 and second data line D2 that are connected to sub-pixels P in different rows and adjacent to each other.

As shown in FIG. 8B, the number of the shielding lines LS, corresponding to a group of first data line D1 and second data line D2 that are connected to sub-pixels P in different rows and adjacent to each other, is two.

As shown in FIG. 9B, the same shielding line LS corresponds to a group of first data line D1 and second data line D2 that are connected to sub-pixels P in different rows and adjacent to each other, and is disposed between the first data line D1 and the second data line D2 that are adjacent to each other.

Equivalent circuit diagrams of FIGS. 7B, 8B and 9B are all as shown in FIG. 7C. That is, FIG. 7C is equivalent to that the first capacitor C1 and the second capacitor C2 are each connected in series with the parasitic capacitor Cp. The function principle of the shielding line(s) LS is as described above, and is not repeated here. On this basis, a mutual influence of the first data line D1 and the second data line D2 that are adjacent to each other may be reduced, thereby reducing the lateral crosstalk and improving the display effect.

A capacitance of the first capacitor C1 is substantially equal to a capacitance of the second capacitor C2, thereby ensuring that the potential jumps are substantially the same when the first data line D1 is influenced by the potential of the second data line D2 and the second data line D2 is influenced by the potential of the first data line D1, so that the two data lines have equivalent lateral crosstalk. In this way, in a case where the lateral crosstalk is improved by using the shielding line(s) LS, when the first data line D1 is influenced by the potential of the second data line D2 and the second data line D2 is influenced by the potential of the first data line D1, the potential jumps have substantially the same reduction, so that the display panel 101 displays uniformly.

It will be known from the above that the first data line D1 and the second data line D2 that are adjacent to each other are close to each other, resulting in a large capacitance of the parasitic capacitor Cp, and the first data line D1 and the second data line D2 that are adjacent to each other have a serious mutual influence. By providing the shielding lines) LS, the mutual influence of the first data line D1 and the second data line D2 that are adjacent to each other may be reduced, thereby reducing the lateral crosstalk and improving the poor display.

In exemplary embodiments, as shown in FIGS. 6B, 7B and 8B, in a case where the shielding line LS constitutes the first capacitor C1 with the first data line D1, an orthographic projection of the shielding line LS on the substrate 10 is at least partially overlapped with an orthographic projection of the first data line D1 on the substrate 10. An area of an overlapped portion is $S_1$, and the capacitance of the first capacitor C1 is $$C1 = \frac{\varepsilon_{r1} S_1}{4\pi k d_1}.$$

Here, $\varepsilon_{r1}$ is a relative dielectric constant of an insulating layer between the first data line D1 and the shielding line LS, $d_1$ is a distance between the first data line D1 and the shielding line LS, and k is the electrostatic force constant.

As shown in FIGS. 5B, 7B and 8B, in a case where the shielding line LS constitutes the second capacitor C2 with the second data line D2, an orthographic projection of the shielding line LS on the substrate 10 is at least partially overlapped with an orthographic projection of the second data line D2 on the substrate 10. An area of an overlapped portion is $S_2$, and the capacitance of the second capacitor C2 is $$C2 = \frac{\varepsilon_{r2} S_2}{4\pi k d_2}.$$

Here, $\varepsilon_{r2}$ is a relative dielectric constant of an insulating layer between the second data line D2 and the shielding line LS, $d_2$ is a distance between the second data line D2 and the shielding line LS, and k is the electrostatic force constant.

The shielding line LS is configured to transmit the fixed voltage. The same fixed voltage is applied to the first shielding line LS1 and the second shielding line LS2. For example, the first shielding line LS1 and the second shielding line LS2 are electrically connected to the second power line VSS, which ensures that potentials of the first shielding line LS1 and the second shielding line LS2 are the same, thereby controlling the potential jumps of the first data line D1 and the second data line D2 to be same as much as possible, so as to improve the display quality.

Different fixed voltages may be applied to the first shielding line LS1 and the second shielding line LS2, respectively.

For example, the first shielding line LS1 is electrically connected to the initialization signal line VINT, and the second shielding line LS2 is electrically connected to the first power line VDD. In this way, the lines in the display panel 101 are flexibly arranged to avoid an excessive density of a local wiring.

In some embodiments, since some existing components of the display panel 101 transmit respective fixed voltages, the existing components (e.g., signal lines or terminals) of the display panel 101 that transmit respective fixed voltages may be reasonably utilized to apply the fixed voltage to the shielding line LS. In this way, a structure for transmitting the fixed voltage to the shielding line LS is not required to be additionally provided, so that a manufacturing process may be simplified, and an internal structure of the display panel may be simplified. Several possible designs for applying the fixed voltage to the shielding line LS by using existing structures in the display panel 101 will be described below.

Figure 10:
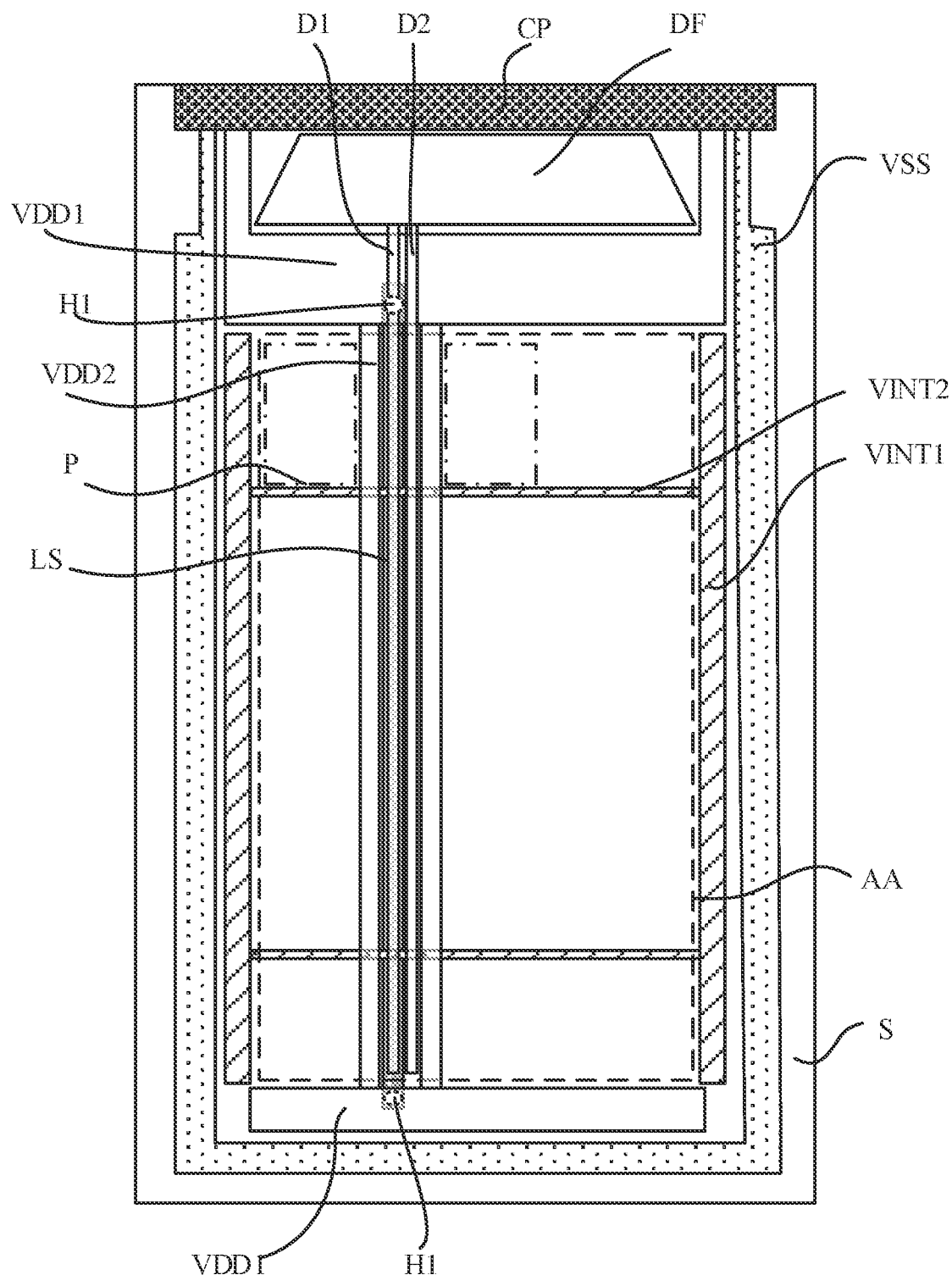
FIG. 10 is a structural diagram showing a connection between a shielding line and a first power line, in accordance with some embodiments.
Figure 11:
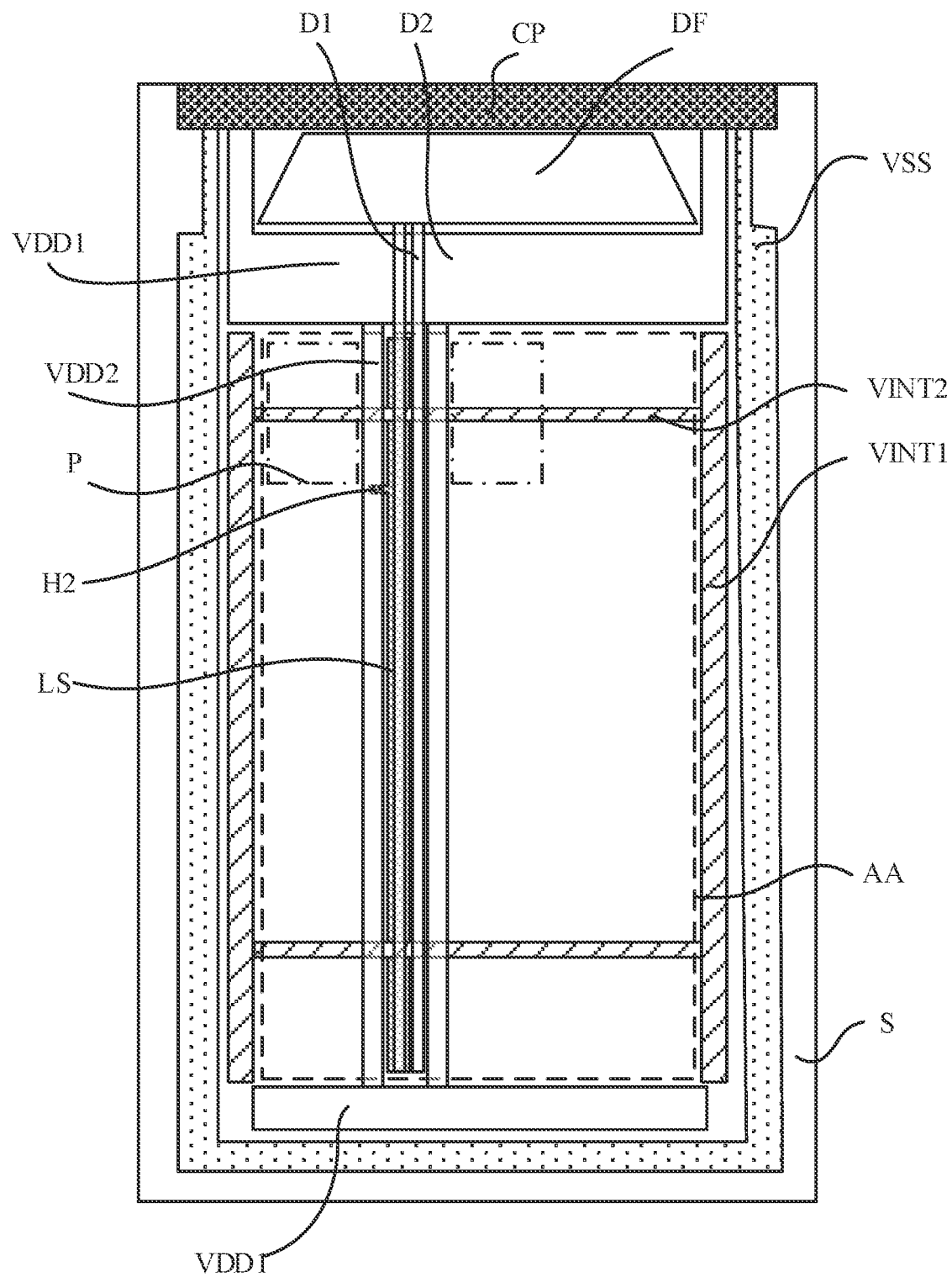
FIG. 11 is a structural diagram showing another connection between a shielding line and a first power line, in accordance with some embodiments.

In some embodiments, as shown in FIGS. 10 and 11, the display panel 101 further includes the first power line VDD connected to the plurality of pixel driving circuits 40. The first power line VDD is configured to transmit a first voltage signal to the plurality of pixel driving circuits 40. The shielding line LS is electrically connected to the first power line VDD.

In embodiments, as shown in FIGS. 10 and 11, the first power line VDD includes sub-power line VDD2(s) located in the display region AA, and power bus(es) VDD1 located in the peripheral region S and electrically connected to the sub-power line(s) VDD2. The sub-power line(s) VDD2 are electrically connected to the plurality of pixel driving circuits 40.

Based on this, in exemplary embodiments, as shown in FIG. 10, the shielding line LS is electrically connected to the power bus(es) VDD1. The shielding line LS is electrically connected to the power bus VDD1 through via hole(s) H1 disposed in the peripheral region S, so as to avoid punching a via hole in the display region AA of the display panel 101, and to prevent the via hole from occupying an effective light-emitting area of the display region AA. FIG. 10 only exemplarily illustrates a single via hole, and there may be one or more via holes for connecting the shielding line LS and the power bus VDD1.

In other exemplary embodiments, as shown in FIG. 11, the shielding line LS is electrically connected to a sub-power line VDD2. The shielding line LS is electrically connected to a sub-power line VDD2 closest to the shielding line LS through a via hole H2, so as to simplify an electrical connection between the shielding line LS and the sub-power line VDD2.

It will be noted that the sub-power line VDD2 and the power bus VDD1 are not distinguished in FIG. 5A. Since the sub-power line VDD2 and the power bus VDD1 each transmit the first voltage signal, a line for transmitting the VDD signal in the figure is labeled as VDD, and in fact, the VDD line in FIG. 5A corresponds to the sub-power line VDD2 in FIG. 10.

Figure 12:
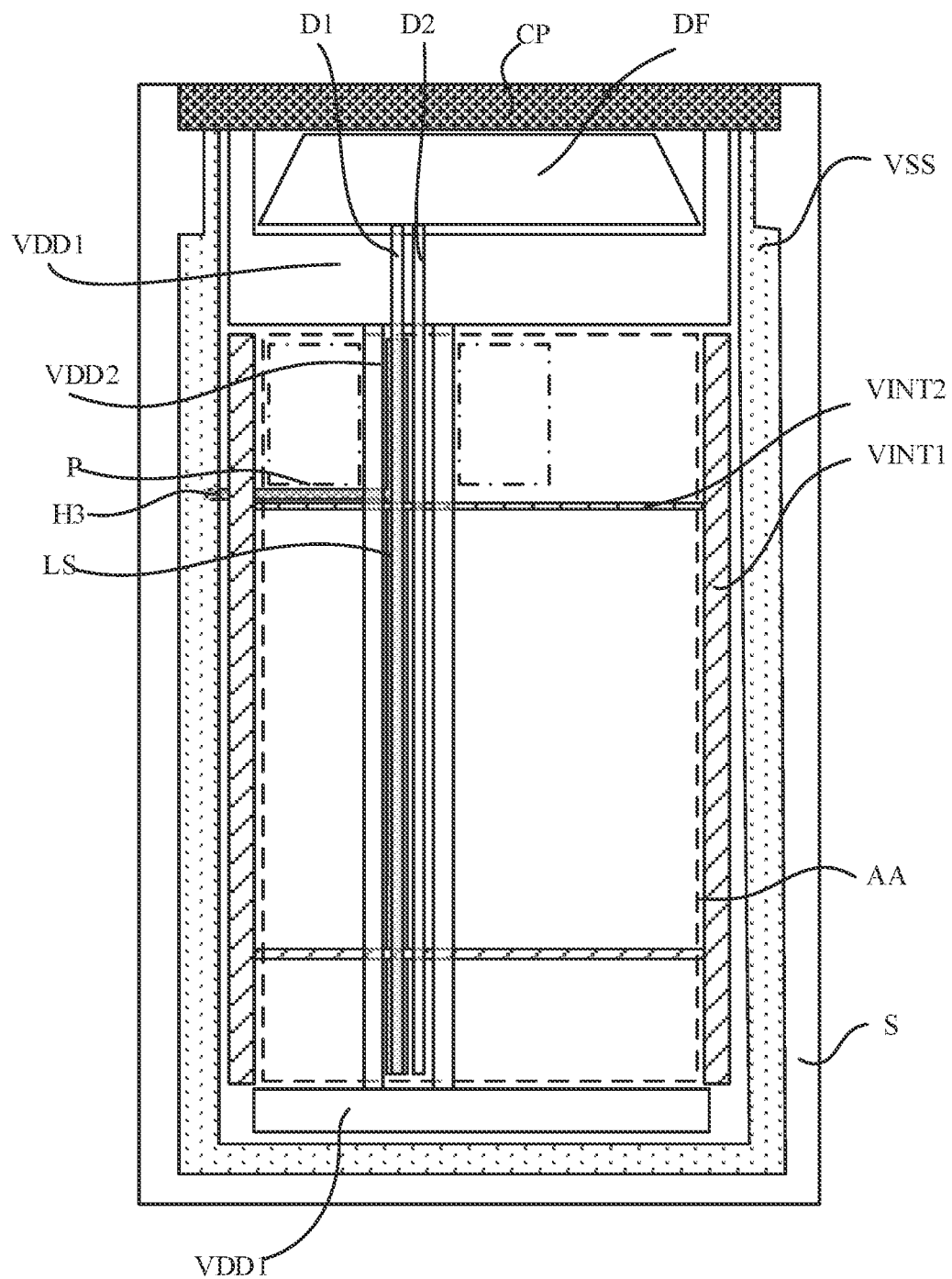
FIG. 12 is a structural diagram showing a connection between a shielding line and a second power line, in accordance with some embodiments.

In some embodiments, as shown in FIG. 12, the display panel 101 further includes the second power line VSS. The second power line VSS is electrically connected to second electrodes of the elements to be driven (e.g., the light-emitting devices L), and is configured to transmit a second voltage signal to the elements to be driven, so that a first electrode and a second electrode of the element to be driven have a voltage difference therebetween, and the element to be driven operates (e.g., emits light) due to an action of the voltage difference. The shielding line LS is electrically connected to the second power line VSS in the peripheral region S through via hole(s) H3, so as to avoid punching a via hole in the display region AA, and to prevent the via hole from occupying an effective light-emitting area of the display region AA. FIG. 12 only exemplarily illustrates a single via hole, and there may be one or more via holes for connecting the shielding line LS and the second power line VSS.

For example, as shown in FIGS. 10 to 15, lines such as the first power line VDD and the second power line VSS are bonded by a bonding pad CP (i.e., COF). Similarly, the first data line D1 and the second data line D2 are connected to the bonding pad CP through a fan-out (i.e., data fan-out) region DF for bonding.

Figure 13:
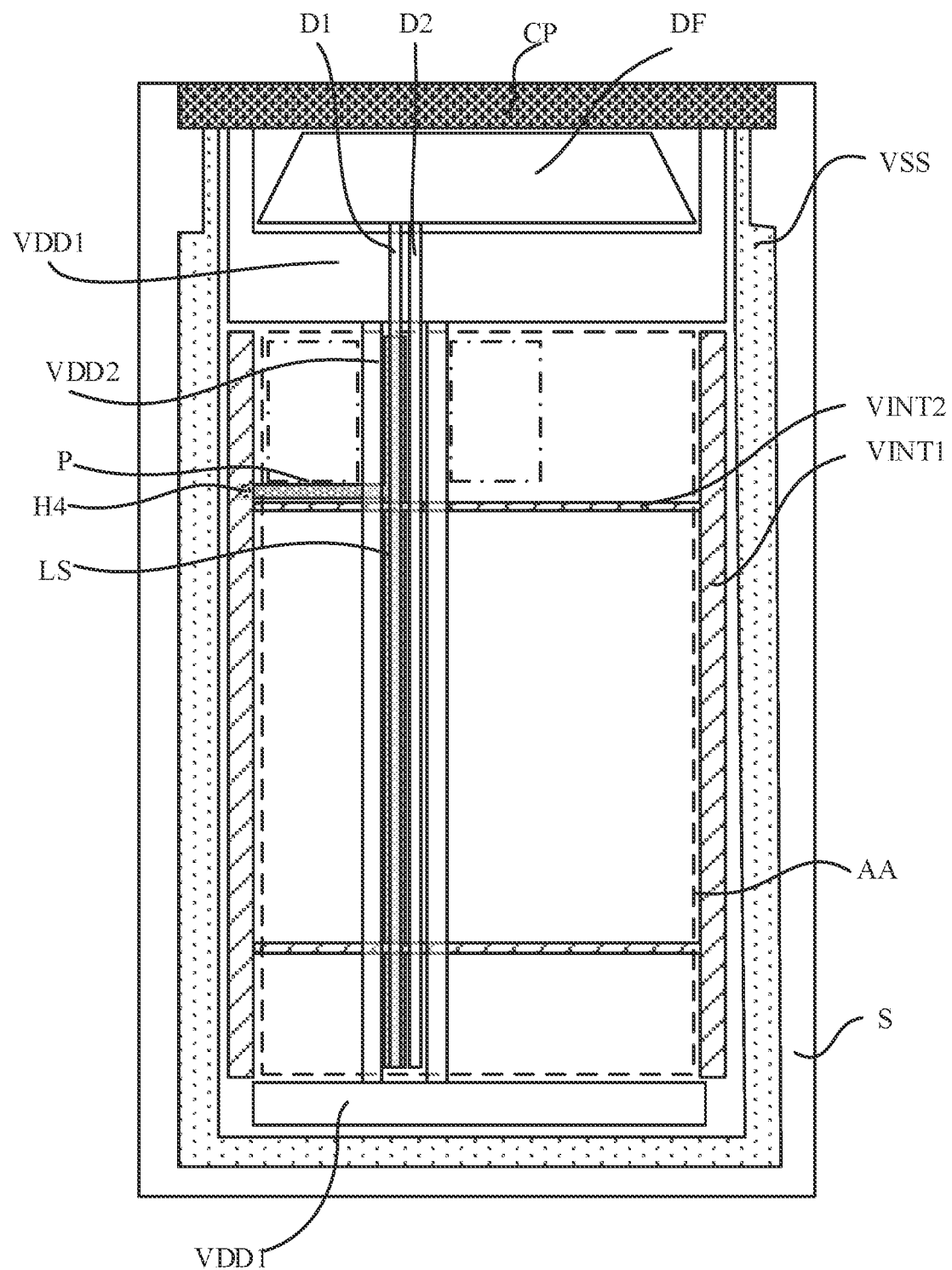
FIG. 13 is a structural diagram showing a connection between a shielding line and an initialization signal line, in accordance with some embodiments.
Figure 14:
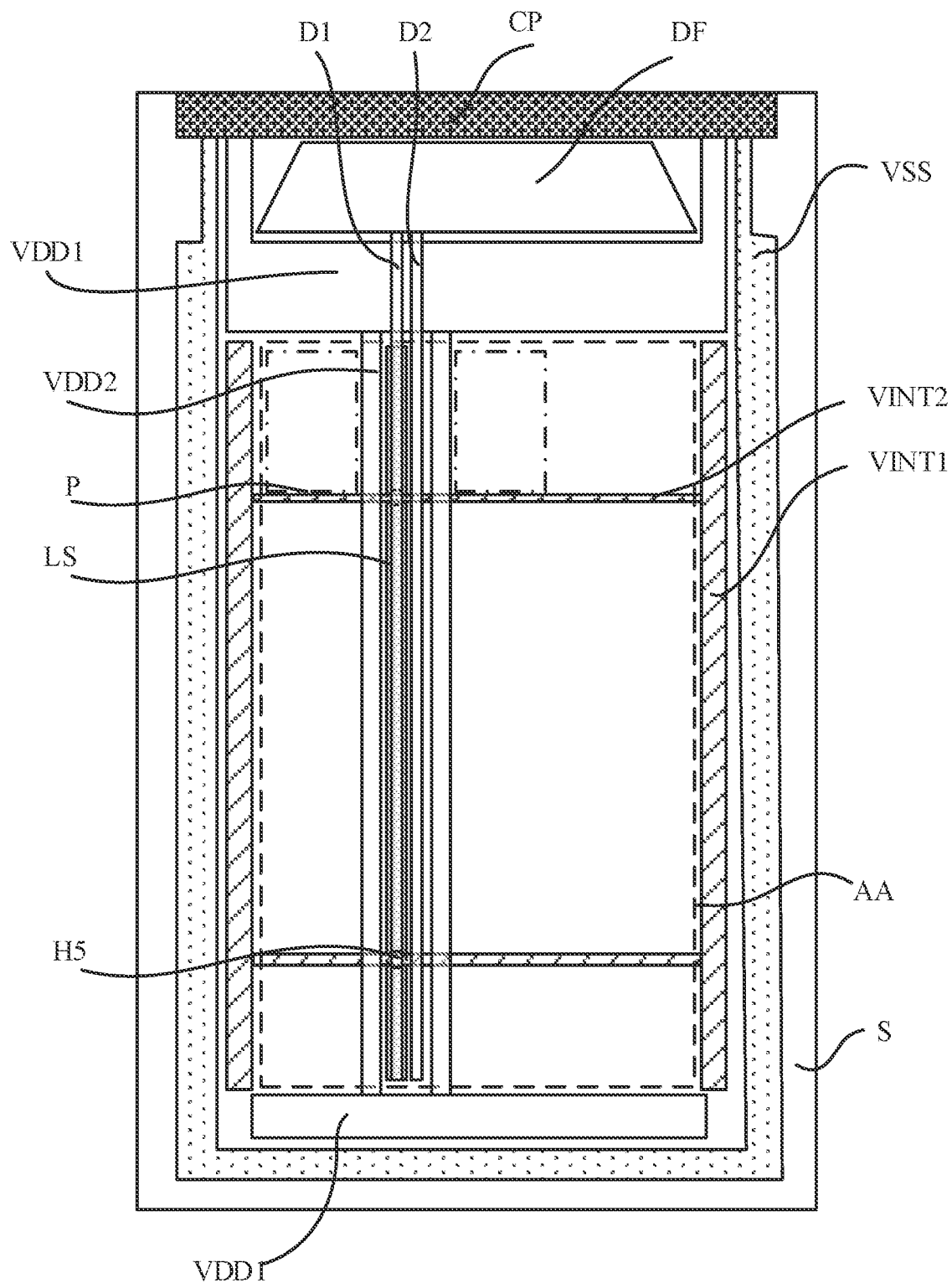
FIG. 14 is a structural diagram showing another connection between a shielding line and an initialization signal line, in accordance with some embodiments.

In some embodiments, as shown in FIGS. 13 and 14, the display panel 101 further includes the initialization signal line VINT. The initialization signal line VINT is electrically connected to the plurality of pixel driving circuits 40, and is configured to transmit an initialization signal to the plurality of pixel driving circuits 40. For example, as shown in FIG. 3, the initialization signal line VINT is used to initialize a potential of the gate 251 of the fifth transistor T5 and a potential of the anode of the light-emitting device L. The shielding line LS is electrically connected to the initialization signal line VINT.

In embodiments, the initialization signal line VINT includes sub-initialization signal line(s) VINT2 located in the display region AA, and initialization signal bus(es) VINT1 located in the peripheral region S and electrically connected to the sub-initialization signal line(s) VINT 2. The sub-initialization signal line(s) VINT2 are electrically connected to the plurality of pixel driving circuits 40.

Based on this, in exemplary embodiments, as shown in FIG. 13, the shielding line LS is electrically connected to the initialization signal bus(es) VINT1. The shielding line LS is electrically connected to the initialization signal bus VINT1 through via hole(s) H4 disposed in the peripheral region S, so as to avoid punching a via hole in the display region AA of the display panel 101, and to prevent the via hole from occupying an effective light-emitting area of the display region AA. FIG. 13 only exemplarily illustrates a single via hole, and there may be one or more via holes for connecting the shielding line LS and the initialization signal bus VINT1.

In other exemplary embodiments, as shown in FIG. 14, the shielding line LS is electrically connected to the sub-initialization signal line(s) VINT2. The shielding line LS is electrically connected to a sub-initialization signal line VINT2 closest to the shielding line LS through a via hole H5, so as to simplify an electrical connection between the shielding line LS and the sub-initialization signal line VINT2.

It will be noted that the sub-initialization signal line VINT2 and the initialization signal bus VINT1 are not distinguished in FIG. 5A. Since the sub-initialization signal line VINT2 and the initialization signal bus VINT1 each transmit the initialization signal, a line for transmitting the VINT signal in the figure is labeled as VINT, and in fact, the VINT line in FIG. 5A corresponds to the sub-initialization signal line VINT2 in FIG. 13.

Figure 15:
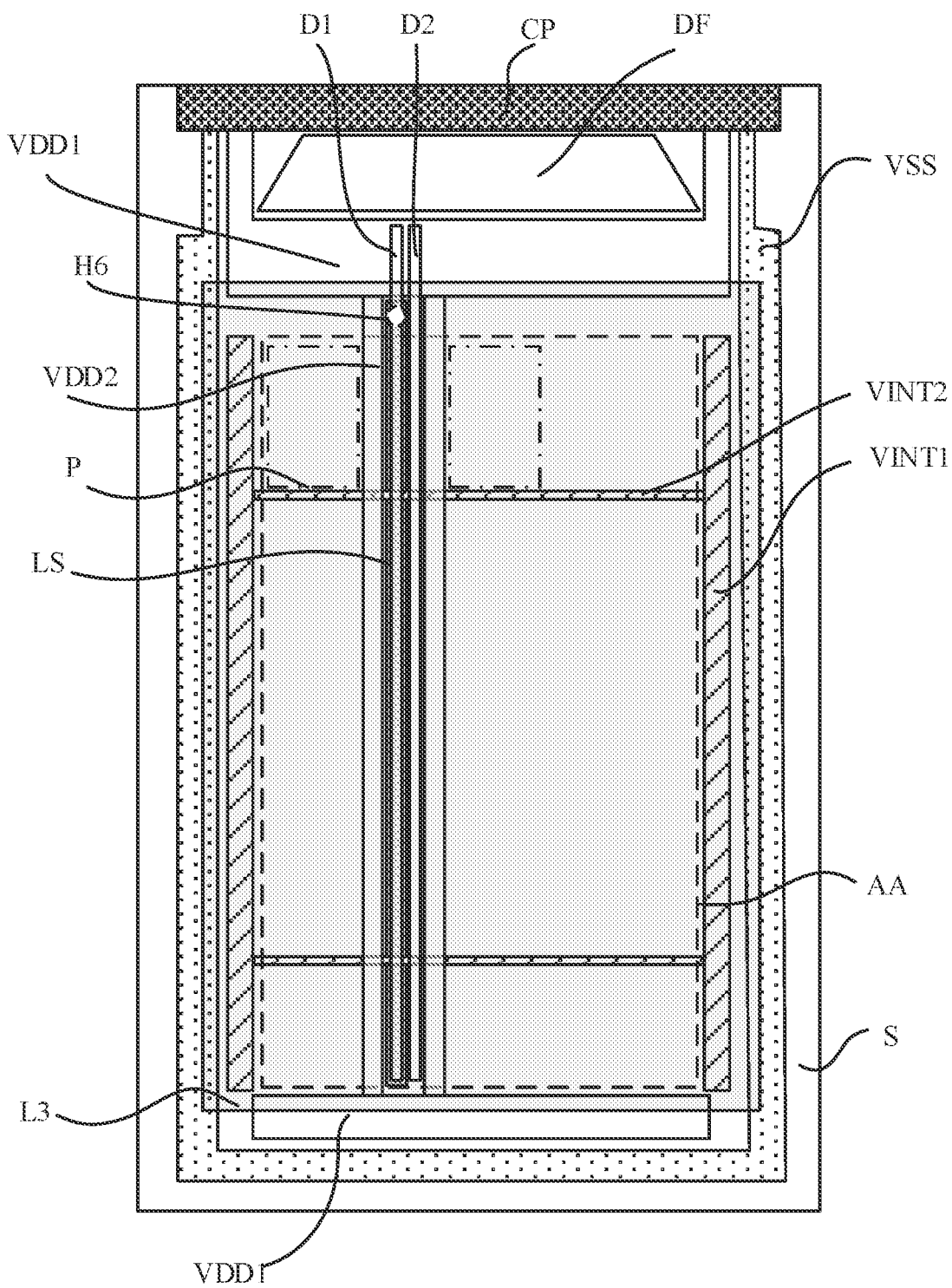
FIG. 15 is a structural diagram showing a connection between a shielding line and a second electrode of an element to be driven, in accordance with some embodiments.

In some embodiments, as shown in FIG. 15, the display panel further includes the elements to be driven (referring to the light-emitting device L in FIG. 1B). The shielding line LS is electrically connected to the second electrode of the element to be driven through a via hole H6. Here, the element to be driven may be, for example, an OLED. The element to be driven includes the first electrode and the second electrode, the first electrode may be the anode L1, and the second electrode may be the cathode L3 is (referring to FIG. 1B).

Based on the above display panel 101, the shielding line(s) may be arranged in a same layer as an existing film layer of the display panel 101 in a specific arrangement process, thereby reducing process steps and simplifying the manufacturing process. Some embodiments in which the shielding line(s) are arranged in a different layer of the display panel 101 are as follows.

It will be noted that the "arranged in the same layer" means that a film layer for forming a specific pattern is formed by a same film forming process, and then is patterned by one patterning process using a same mask to form a layer structure. Depending on different specific patterns, the one patterning process may include several exposure, development or etching processes, and the specific patterns in the formed layer structure may be continuous or discontinuous, and these specific patterns may also be at different heights or have different thicknesses.

In some embodiments, as shown in FIGS. 5A, 5B, 6A, 6B, 7A, 7B, 8A and 8B, the shielding line(s) LS are disposed between a film layer (e.g., the source-drain conductive layer) where the first data line D1 and the second data line D2 are located and the substrate 10. For example, the shielding line(s) LS are arranged in a film layer where the light-shielding patterns between the source-drain conductive layer and the substrate 10 are located. The shielding line(s) LS and the light shielding patterns 30 are made of a same material, and are arranged in the same layer.

On this basis, the shielding line(s) LS and the light-shielding patterns 30 are arranged in the same layer, so that the shielding line(s) LS and the light-shielding patterns 30 may be manufactured synchronously, which simplifies the manufacturing process.

For example, a distance $d_p$ between the first data line D1 and the second data line D2 that are arranged adjacent to each other is greater than a distance (i.e., $d_2$) between the shielding line and the film layer where the first data line D1 and the second data line D2 are located in a thickness direction of the substrate 10 (i.e., the thickness direction of the display substrate 31), so that the capacitance of the parasitic capacitor Cp is controlled to be less than both the capacitance of the first capacitor C1 and the second capacitor C2 by controlling the distances between the electrode plates, thereby enhancing the voltage division effects of the first capacitor C1 and the second capacitor C2, so as to reduce an influence of the parasitic capacitor Cp on a data line in a floating state and reduce a potential jump of the data line.

For example, the parasitic capacitance generated between the first data line D1 and the second data line D2 that are arranged adjacent to each other is less than the capacitance of the first capacitor C1 and/or the capacitance of the second capacitor C2, thereby ensuring significant voltage division effects of the first capacitor C1 and the second capacitor C2, so as to reduce the influence of the parasitic capacitor Cp on the data line in the floating state. The means of controlling the capacitance of the parasitic capacitor to be less than the capacitance of the first capacitor C1 and/or the capacitance of the second capacitor C2 includes: increasing an overlapping area of the shielding line LS and the first data line D1 and/or an overlapping area of the shielding line LS and the second data line D2.

For example, the distance d2 between the shielding line LS and the film layer where the first data line D1 and the second data line D2 are located in the thickness direction of the substrate 10 is in a range of 0.75 μm to 1 μm, inclusive, such as 0.75 μm, 0.8 μm, 0.85 μm, 0.9 μm, or 1 μm. The distance $d_p$ between the first data line D1 and the second data line D2 that are adjacent to each other is in a range of 4 μm to 8 μm, inclusive, such as 4 μm, 4.8 μm, 5 μm, 5.5 μm, 6 μm, 6.3 μm, 7 μm, or 8 μm.

In exemplary embodiments, the shielding line(s) LS and the light-shielding patterns 30 are arranged in the same layer. The distance d2 between the shielding line LS and the film layer where the first data line D1 and the second data line D2 are located in the thickness direction of the substrate 10 is in a range of 0.8 μm to 0.9 μm, inclusive, such as 0.8 μm, 0.85 μm or 0.9 μm.

In exemplary embodiments, the shielding line(s) LS and the light-shielding patterns 30 are arranged in the same layer. The distance $d_p$ between the first data line D1 and the second data line D2 that are adjacent to each other is in a range of 5 μm to 7 μm, inclusive, such as 5 μm, 5.5 μm, 6 μm or 7 μm.

It will be noted that the first data line D1 and the second data line D2 are arranged in the same layer, the shielding line(s) LS are disposed between the film layer (e.g., the source-drain conductive layer) where the first data line and the second data line are located and the substrate 10, and at least the interlayer dielectric layer ILD and the gate insulating layer GI are disposed between the source-drain conductive layer and the shielding line LS. The thickness of the interlayer dielectric layer ILD is at least 0.5 μm, the thickness of the gate insulating layer GI is at least 0.25 μm, so that a distance between the source-drain conductive layer and the shielding line LS is at least 0.75 μm. In a case where another gate insulating layer GI is further disposed between the source-drain conductive layer and the shielding line LS, the thickness of the another gate insulating layer GI is at least 0.25 μm, so that the distance between the source-drain conductive layer and the shielding line LS is at least 1 μm.

In some embodiments, as shown in FIGS. 9A and 9B, the shielding line LS and the film layer where the first data line D1 and the second data line D2 that are adjacent to each other are located are made of a same material, and are arranged in the same layer. The shielding line LS is located between the first data line D1 and the second data line D2 that are adjacent to each other. In this case, a side surface of the shielding line LS opposite to the first data line D1 constitutes the first capacitor C1 with the first data line D1, and a side surface of the shielding line LS opposite to the second data line D2 constitutes the second capacitor C2 with the second data line D2.

Based on this, the shielding line LS, the first data line D1 and the second data line D2 may be manufactured synchronously, which simplifies the manufacturing process.

In some embodiments, the shielding line(s) LS are disposed on a side, away from the substrate 10, of the film layer where the first data line D1 and the second data line D2 are located.

Based on the above embodiments, for the display panel 101 not provided with the shielding line LS and the display panel 101 provided with the shielding line LS, the lateral crosstalk of the data lines is detected, and the results are as follows.

Figure 16:
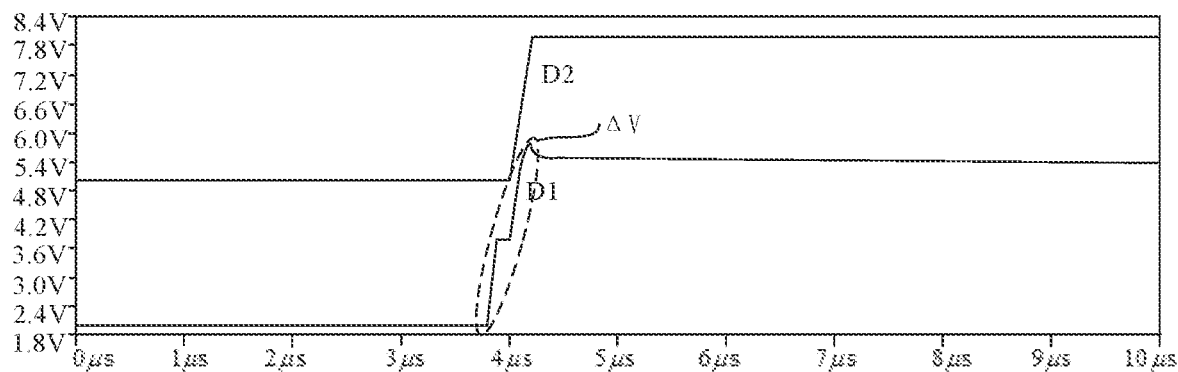
FIG. 16 is a simulation graph of potentials of a first data line and a second data line in a case where a display panel is not provided with a shielding line, in accordance with some embodiments.

As shown in FIG. 16, in a case where no shielding line LS is disposed below the first data line D1 and the second data line D2 that are adjacent to each other, when the potential of the second data line D2 jumps, the potential of the first data line D1 jumps, and the potential jump is large (indicated by the loop of dotted line in the figure), which has a large influence on the stability of the potential of the first data line D1, and causes the lateral crosstalk and the poor display.

Figure 17:
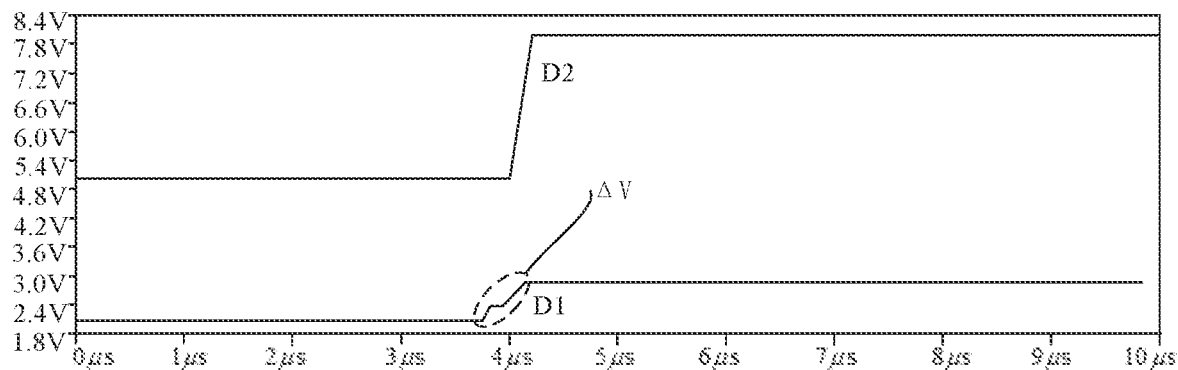
FIG. 17 is a simulation graph of potentials of a first data line and a second data line in a case where a display panel is provided with a shielding line, in accordance with some embodiments.

As shown in FIG. 17, in a case where the shielding line LS is disposed below the first data line D1 and second data line D2 that are adjacent to each other, and the shielding line LS constitutes the first capacitor C1 with the first data line D1 when the potential of the second data line D2 jumps, the potential of the first data line D1 jumps, but the potential jump is small (indicated by the loop of dotted line in the figure). Therefore, the shielding line LS may reduce the influence on the potential of the first data line D1, thereby reducing the lateral crosstalk and improving the poor display.

In another aspect, as shown in FIG. 1A, embodiments of the present disclosure provide the display device 100 including the display panel 101.

The display device 100 may be any device that displays images whether moving (e.g., videos) or stationary (e.g., still images). More specifically, it is anticipated that the embodiments may be implemented in, or associated with, a variety of electronic devices. The variety of electronic devices are, for example (but not limit to), mobile phones, wireless devices, personal data assistants (PDAs), hand-held or portable computers, global positioning system (GPS) receivers/navigators, cameras, MP4 video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packaging and aesthetic structures (e.g., displays for displaying an image of a piece of jewelry).

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
    a substrate;
    a plurality of pixel driving circuits disposed on the substrate and arranged in an array;
    a plurality of first data lines disposed on the substrate, a first data line in the plurality of first data lines being electrically connected to pixel driving circuits in even-numbered rows in a same column of pixel driving circuits;
    a plurality of second data lines disposed on the substrate, a second data line in the plurality of second data lines that is arranged adjacent to the first data line being electrically connected to pixel driving circuits in odd-numbered rows in a same column of pixel driving circuits; the first data line and the second data line having an overlapping area therebetween; and
    at least one shielding line disposed on the substrate and configured to transmit a fixed voltage, wherein the at least one shielding line constitutes a first capacitor with the first data line, and/or a second capacitor with the second data line;
    wherein a parasitic capacitance generated between the first data line and the second data line is less than at least one of a capacitance of the first capacitor or a capacitance of the second capacitor.

2. The display panel according to claim 1, wherein a capacitance of the first capacitor and a capacitance of the second capacitor are equal.

3. The display panel according to claim 1, wherein a shielding line in the at least one shielding line constitutes the first capacitor with the first data line, and an orthographic projection of the shielding line on the substrate is at least partially overlapped with an orthographic projection of the first data line on the substrate; and
    the shielding line constitutes the second capacitor with the second data line, and the orthographic projection of the shielding line on the substrate is at least partially overlapped with an orthographic projection of the second data line on the substrate.

4. The display panel according to claim 1, wherein the at least one shielding line includes a first shielding line and a second shielding line; wherein
    the first shielding line constitutes the first capacitor with the first data line; and
    the second shielding line constitutes the second capacitor with the second data line.

5. The display panel according to claim 1, further comprising:
    elements to be driven, first electrodes of the elements to be driven being respectively electrically connected to the plurality of pixel driving circuit;
    a first power line electrically connected to the plurality of pixel driving circuits and configured to transmit a first voltage signal to the plurality of pixel driving circuits;
    a second power line electrically connected to second electrodes of the elements to be driven and configured to transmit a second voltage signal to the elements to be driven; and
    an initialization signal line electrically connected to the plurality of pixel driving circuits and configured to transmit an initialization signal to the plurality of pixel driving circuits; wherein
    the at least one shielding line is electrically connected to the first power line, the second power line, second electrodes of the elements to be driven or the initialization signal line.

6. The display panel according to claim 5, wherein the display panel has a display region and a peripheral region, and
    the first power line includes at least one sub-power line located in the display region, and a power bus located in the peripheral region and electrically connected to the at least one sub-power line; and the at least one sub-power line is electrically connected to the plurality of pixel driving circuits; wherein
    the at least one shielding line is electrically connected to the at least one sub-power line and/or the power bus.

7. The display panel according to claim 6, wherein a shielding line in the at least one shielding line is electrically connected to a sub-power line in the at least one sub-power line that is closest to the shielding line; and/or
    the at least one shielding line is electrically connected to the power bus through a via hole disposed in the peripheral region.

8. The display panel according to claim 5, wherein the display panel has a display region and a peripheral region; and
    the at least one shielding line is electrically connected to the second power line through a via hole disposed in the peripheral region.

9. The display panel according to claim 5, wherein the display panel has a display region and a peripheral region; and the initialization signal line includes at least one sub-initialization signal line located in the display region, and an initialization signal bus located in the peripheral region and electrically connected to the at least one sub-initialization signal line; and the at least one sub-initialization signal line is electrically connected to the plurality of pixel driving circuits; wherein the at least one shielding line is electrically connected to the at least one sub-initialization signal line and/or the initialization signal bus.

10. The display panel according to claim 9, wherein a shielding line in the at least one shielding line is electrically connected to a sub-initialization signal line in the at least one sub-initialization signal line that is closest to the shielding line; and/or the at least one shielding line is electrically connected to the initialization signal bus through a via hole disposed in the peripheral region.

11. The display panel according to claim 1, wherein the at least one shielding line is disposed between a film layer where the first data line and the second data line are located and the substrate.

12. The display panel according to claim 11, further comprising:

light-shielding patterns disposed between a film layer where the plurality of pixel driving circuits are located and the substrate; wherein the at least one shielding line and the light-shielding patterns are made of a same material, and are arranged in a same layer.

13. The display panel according to claim 11, wherein a distance between the first data line and the second data line is greater than a distance between the at least one shielding line and the film layer where the first data line and the second data line are located in a thickness direction of the substrate.

14. The display panel according to claim 13, wherein the distance between the at least one shielding line and the film layer where the first data line and the second data line are located in the thickness direction of the substrate is in a range of 0.75 μm to 1 μm, inclusive; and the distance between the first data line and the second data line is in a range of 4 μm to 8 μm, inclusive.

15. The display panel according to claim 1, wherein the at least one shielding line is arranged in a same layer as the first data line and the second data line, and is located between the first data line and the second data line.

16. The display panel according to claim 1, wherein the plurality of first data lines and the plurality of second data lines are alternately arranged in a row direction of the plurality of pixel driving circuits, and the first data line and the second data line are located between two adjacent columns of pixel driving circuits.

17. The display panel according to claim 1, wherein the first data line and the second data line are respectively located on two sides of a same column of pixel driving circuits.

18. A display device comprising the display panel according to claim 1.

19. A display panel, comprising:

a substrate;

a plurality of pixel driving circuits disposed on the substrate and arranged in an array;

a plurality of first data lines disposed on the substrate, a first data line in the plurality of first data lines being electrically connected to pixel driving circuits in even-numbered rows in a same column of pixel driving circuits;

a plurality of second data lines disposed on the substrate, a second data line in the plurality of second data lines that is arranged adjacent to the first data line being electrically connected to pixel driving circuits in odd-numbered rows in a same column of pixel driving circuits; the first data line and the second data line having an overlapping area therebetween; and at least one shielding line disposed on the substrate and configured to transmit a fixed voltage, wherein the at least one shielding line constitutes a first capacitor with the first data line, and/or a second capacitor with the second data line;

wherein a capacitance of the first capacitor and a capacitance of the second capacitor are equal.

20. The display panel according to claim 19, wherein a shielding line in the at least one shielding line constitutes the first capacitor with the first data line, and an orthographic projection of the shielding line on the substrate is at least partially overlapped with an orthographic projection of the first data line on the substrate; and the shielding line constitutes the second capacitor with the second data line, and the orthographic projection of the shielding line on the substrate is at least partially overlapped with an orthographic projection of the second data line on the substrate.

* * * * *